United States Patent
Sarkis et al.

(10) Patent No.: US 11,063,613 B2
(45) Date of Patent: Jul. 13, 2021

(54) EARLY TERMINATION OF SUCCESSIVE CANCELLATION LIST DECODING

(71) Applicant: Qualcomm Incorporated, San Diego, CA (US)

(72) Inventors: Gabi Sarkis, San Diego, CA (US); Hari Sankar, San Diego, CA (US); Gaojin Wu, Beijing (CN); Changlong Xu, Beijing (CN); Jing Jiang, San Diego, CA (US); Huang Lou, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 66 days.

(21) Appl. No.: 16/605,911

(22) PCT Filed: May 15, 2017

(86) PCT No.: PCT/CN2017/084302
§ 371 (c)(1),
(2) Date: Oct. 17, 2019

(87) PCT Pub. No.: WO2018/209486
PCT Pub. Date: Nov. 22, 2018

(65) Prior Publication Data
US 2021/0152191 A1    May 20, 2021

(51) Int. Cl.
*H03M 13/37* (2006.01)
*H03M 13/13* (2006.01)

(52) U.S. Cl.
CPC ....... *H03M 13/3753* (2013.01); *H03M 13/13* (2013.01)

(58) Field of Classification Search
None
See application file for complete search history.

(56) References Cited

U.S. PATENT DOCUMENTS

2015/0091742 A1* 4/2015 Ionita .................. H04L 25/4917
                                                           341/57
2016/0191078 A1   6/2016 Gilbert et al.
(Continued)

FOREIGN PATENT DOCUMENTS

| CN | 105874736 A | 8/2016 |
| WO | WO-2015123855 A1 | 8/2015 |
| WO | WO 2015139248 A1 | 9/2015 |

OTHER PUBLICATIONS

International Search Report and Written Opinion—PCT/CN2017/084302—ISA/EPO—dated Jan. 26, 2018.
(Continued)

*Primary Examiner* — Thien Nguyen
(74) *Attorney, Agent, or Firm* — Holland & Hart LLP/Qualcomm

(57) ABSTRACT

Techniques are described herein to terminate a list decoding operation before its completion based on performing one or more error check processes. A transmitted codeword encoded using a polar code may include one or more error check vectors interspersed with one or more information vectors. Upon receiving the codeword, a decoder may perform a list decoding operation on the received codeword. Upon decoding one of the error check vectors, the decoder may determine whether at least one candidate path used in the successive cancellation list decoding operation passes an error check process based on the error check vector. If no candidate paths satisfy the error check process, the decoder may terminate the list decoding operation. In some examples, the decoder may recheck whether candidate paths satisfy the error check operation at intermediate positions between error check vectors. Such rechecking may occur while decoding information vectors.

40 Claims, 13 Drawing Sheets

(56) References Cited

U.S. PATENT DOCUMENTS

| | | | |
|---|---|---|---|
| 2016/0241257 A1 | 8/2016 | Winstead et al. | |
| 2016/0352464 A1 | 12/2016 | Shen et al. | |
| 2018/0331697 A1* | 11/2018 | Lin | H03M 13/6502 |
| 2019/0044530 A1* | 2/2019 | Ionita | H04L 1/0041 |
| 2020/0021307 A1* | 1/2020 | Ionita | H03M 13/251 |
| 2020/0099393 A1* | 3/2020 | Xu | H03M 13/13 |

OTHER PUBLICATIONS

NTT DOCOMO: "Distributed Simple Parity Check Polar Codes", 3GPP Draft, 3GPP TSG RAN WG1 Meeting #88bis, R1-1705757, 3rd Generation Partnership Project (3GPP), Mobile Competence Centre, 650, Route Des Lucioles, F-06921 Sophia-Antipolis Cedex, France vol. RAN WG1, No. Spokane, USA, Apr. 3, 2017 Apr. 7, 2017 Apr. 2, 2017 (Apr. 2, 2017), XP051243872, pp. 1-6, Retrieved from the Internet: URL:http://www.3gpp.org/ftp/Meetings_3GPP¬_sync/ran1/Docs/ [retrieved on Apr. 2, 2017].
Supplementary European Search Report—EP17910155—Search Authority—Munich—dated Nov. 4, 2020.

* cited by examiner

EARLY TERMINATION OF SUCCESSIVE CANCELLATION LIST DECODING

CROSS REFERENCE

The present application is a 371 national phase filing of International Application No. PCT/CN2017/084302 by Sarkis et al., entitled "EARLY TERMINATION OF SUCCESSIVE CANCELLATION LIST DECODING," filed May 15, 2017, assigned to the assignee hereof, and expressly incorporated herein.

BACKGROUND

The following relates generally to wireless communication, and more specifically to early termination of successive cancellation list decoding.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Information transmitted between devices in wireless multiple-access communications systems may be encoded into a codeword in order to improve the reliability of successfully decoding the transmitted information. In some cases, codewords may provide redundancy, which may be used to correct errors that result from the transmission environment (e.g., path loss, obstacles, etc.). Some examples of encoding algorithms with error correcting codes include convolutional codes (CCs), low-density parity-check (LDPC) codes, and polar codes. A polar code is an example of a linear block error correcting code and has been shown to asymptotically approach the theoretical channel capacity as the code length increases. Polar codes are based on polarization of sub-channels used for information bits or frozen bits (e.g, predetermined bits set to a '0' or a '1'), with information bits generally assigned to the higher reliability sub-channels. However, practical implementations of a polar decoder are complex (e.g, due to the ordered nature of decoding and list decoding techniques used for improving the error-correcting performance) and may introduce latency in order to increase reliability. As such, traditional polar coding techniques may not adequately meet the low latency standards of some wireless communications. Techniques for high-performance polar codes for low latency communications are desired.

SUMMARY

The described techniques relate to improved methods, systems, devices, or apparatuses that support early termination of successive cancellation list decoding. Generally, the described techniques provide for termination of a list decoding operation before its completion based on performing one or more error check processes. A transmitted codeword encoded using a polar code may include one or more error check vectors interspersed with one or more information vectors. Upon receiving the codeword, a decoder may perform a list decoding operation on the received codeword. Upon decoding one of the error check vectors, the decoder may determine whether at least one candidate path used in the successive cancellation list decoding operation passes an error check process based on the error check vector. If no candidate paths satisfy the error check process, the decoder may terminate the list decoding operation. In some examples, the decoder may recheck whether candidate paths satisfy the error check operation at intermediate positions between error check vectors. Such rechecking may occur during the successive cancellation list decoding process for at least one information bit location that is subsequent to the error check vector being applied according to a decoding order of the polar code.

A method of wireless communication is described. The method may include monitoring, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code, performing a list decoding operation on a first portion of sub-channels of the decoding candidate corresponding to the first information vector and the first error check vector to obtain a first set of list decoding paths, determining, for the first set of list decoding paths, that at least one list decoding path of the first set of list decoding paths satisfies a first error check process using respective decoding path candidates for the first error check vector and the first information vector, performing the list decoding operation on a second portion of the sub-channels of the decoding candidate corresponding to at least a subset of the second information vector to obtain a second set of list decoding paths that are based at least in part on the first set of list decoding paths, and determining whether at least one of the second set of decoding paths satisfy the first error check process.

An apparatus for wireless communication is described. The apparatus may include means for monitoring, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code, means for performing a list decoding operation on a first portion of sub-channels of the decoding candidate corresponding to the first information vector and the first error check vector to obtain a first set of list decoding paths, means for determining, for the first set of list decoding paths, that at least one list decoding path of the first set of list decoding paths satisfies a first error check process using respective decoding path candidates for the first error check vector and the first information vector, means for performing the list decoding operation on a second portion of the sub-channels of the decoding candidate corresponding to at least a subset of the second information vector to obtain a second set of list decoding paths that are based at least in part on the first set of list decoding paths, and means for determining whether at least one of the second set of decoding paths satisfy the first error check process.

Another apparatus for wireless communication is described. The apparatus may include a processor, memory in electronic communication with the processor, and instructions stored in the memory. The instructions may be operable to cause the processor to monitor, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code, perform a list decoding operation on a first portion of sub-channels of the decoding candidate corresponding to the first information vector and the first error check vector to obtain a first set of list decoding paths, determine, for the first set of list decoding paths, that at least one list decoding path of the first set of list decoding paths satisfies a first error check process using respective decoding path candidates for the first error check vector and the first information vector, perform the list decoding operation on a second portion of the sub-channels of the decoding candidate corresponding to at least a subset of the second information vector to obtain a second set of list decoding paths that are based at least in part on the first set of list decoding paths, and determine whether at least one of the second set of decoding paths satisfy the first error check process.

A non-transitory computer readable medium for wireless communication is described. The non-transitory computer-readable medium may include instructions operable to cause a processor to monitor, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code, perform a list decoding operation on a first portion of sub-channels of the decoding candidate corresponding to the first information vector and the first error check vector to obtain a first set of list decoding paths, determine, for the first set of list decoding paths, that at least one list decoding path of the first set of list decoding paths satisfies a first error check process using respective decoding path candidates for the first error check vector and the first information vector, perform the list decoding operation on a second portion of the sub-channels of the decoding candidate corresponding to at least a subset of the second information vector to obtain a second set of list decoding paths that are based at least in part on the first set of list decoding paths, and determine whether at least one of the second set of decoding paths satisfy the first error check process.

Some examples of the method, apparatus, and non-transitory computer-readable medium described above may further include processes, features, means, or instructions for terminating, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate.

Some examples of the method, apparatus, and non-transitory computer-readable medium described above may further include processes, features, means, or instructions for marking the at least one list decoding path of the first set of list decoding paths that satisfies the first error check process using the first error check vector, wherein determining whether at least one of the second set of decoding paths satisfy the first error check process may be based at least in part on the marking of the at least one list decoding path.

Some examples of the method, apparatus, and non-transitory computer-readable medium described above may further include processes, features, means, or instructions for propagating the marking of the at least one list decoding path to child list decoding paths as part of performing the list decoding operation on the second portion of the sub-channels of the decoding candidate, wherein each child list decoding path associated with the second portion of the sub-channels of the decoding candidate includes an indication of whether the child list decoding path was marked during the first error check process.

Some examples of the method, apparatus, and non-transitory computer-readable medium described above may further include processes, features, means, or instructions for performing the list decoding operation on a third portion of the sub-channels of the decoding candidate corresponding to the first information vector, the second information vector, the first error check vector, and a second error check vector to obtain a third set of list decoding paths, the second error check vector positioned after the second information vector. Some examples of the method, apparatus, and non-transitory computer-readable medium described above may further include processes, features, means, or instructions for determining, for the third set of list decoding paths, that at least one list decoding path of the third set of list decoding paths satisfies both the first error check process and a second error check process using respective decoding path candidates for the first information vector, the first error check vector, the second information vector, and the second error check vector.

Some examples of the method, apparatus, and non-transitory computer-readable medium described above may further include processes, features, means, or instructions for performing the list decoding operation on a fourth portion of the sub-channels of the decoding candidate corresponding to at least a subset of a third information vector positioned after the second error check vector to obtain a fourth set of list decoding paths that may be based at least in part on the third set of list decoding paths. Some examples of the method, apparatus, and non-transitory computer-readable medium described above may further include processes, features, means, or instructions for determining whether at least one of the fourth set of list decoding paths satisfies the first error check process and the second error check process.

Some examples of the method, apparatus, and non-transitory computer-readable medium described above may further include processes, features, means, or instructions for terminating, prior to completion of the list decoding operation on the decoding candidate of the codeword, the list decoding operation based at least in part on a failure of the first error check process and a failure of the second error check process for all of the fourth set of list decoding paths determined while performing the list decoding operation on the fourth portion of the sub-channels of the decoding candidate.

Some examples of the method, apparatus, and non-transitory computer-readable medium described above may further include processes, features, means, or instructions for performing the first error check process using the first error check vector on the second set of decoding paths as part of performing the list decoding operation on the second portion of the sub-channels of the decoding candidate corresponding to at least the subset of the second information vector, wherein determining whether at least one of the second set of decoding paths satisfies the first error check process may be based at least in part on performing the first error check process while performing the list decoding operation on the second portion of the sub-channels of the decoding candidate.

In some examples of the method, apparatus, and non-transitory computer-readable medium described above, the determining whether at least one of the second set of decoding paths satisfy the first error check process occurs at a plurality of intermediate locations of the second portion of the sub-channels of the decoding candidate corresponding to at least the subset of the second information vector.

In some examples of the method, apparatus, and non-transitory computer-readable medium described above, the plurality of intermediate locations corresponds to each sub-channel of the second portion of the sub-channels of the decoding candidate.

DETAILED DESCRIPTION

Figure 1:
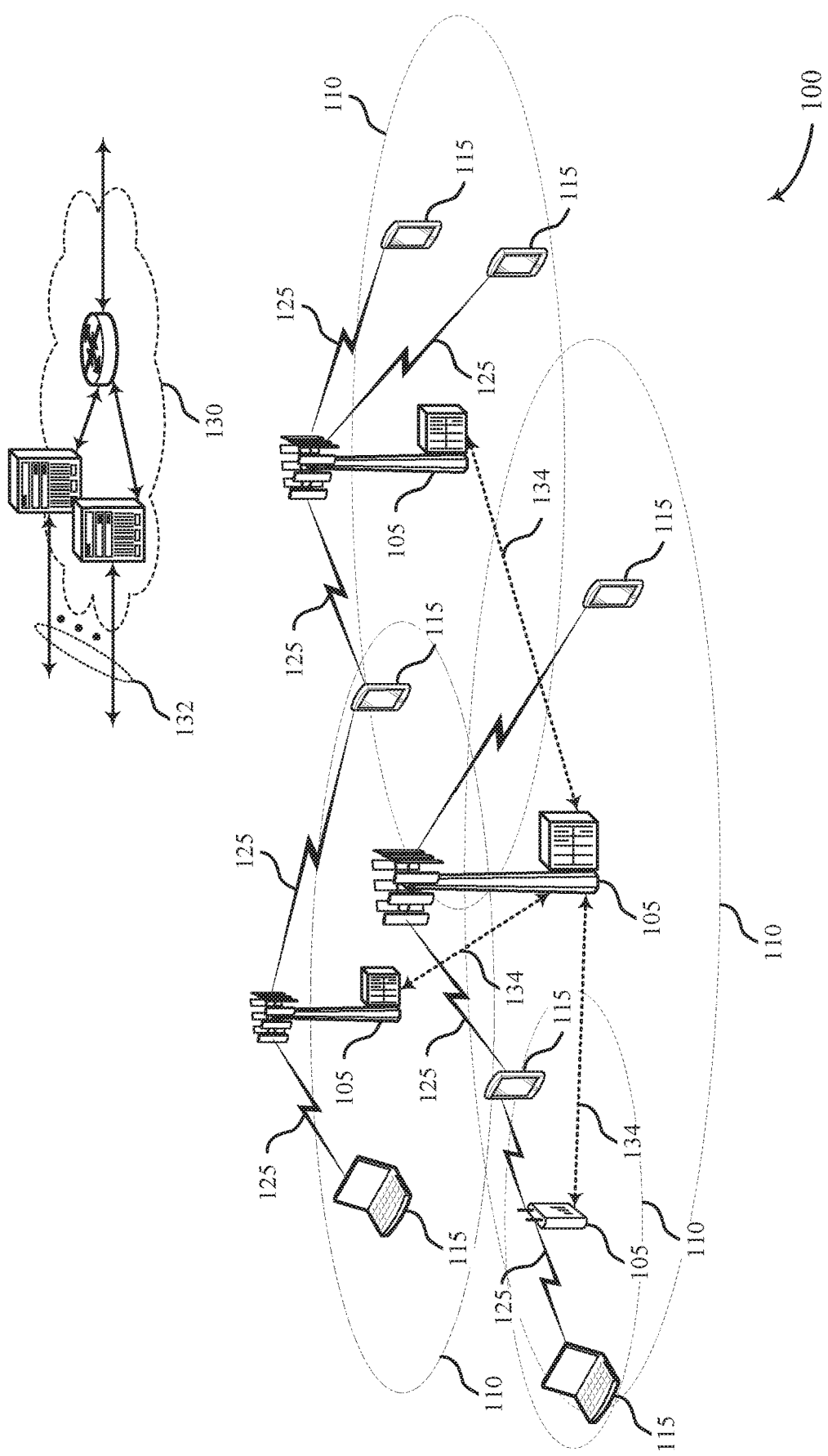
FIG. 1 illustrates an example of a system for wireless communication that supports early termination of successive cancellation list decoding in accordance with aspects of the present disclosure.

In some wireless systems, a base station or a UE may transmit a payload containing information to be decoded at a receiving device. The message received by the receiving device may include the payload with some amount of noise introduced by the transmission over a wireless communication link. In some cases, the noise may cause errors to creep into the information of the payload. To correct for such errors, the payload may be encoded using an error-correcting code, such as a polar code. When decoding the polar code, the receiving device may use successive cancellation decoding to determine a representation of the original message from the received codeword. The representation may be checked using an error checking code (e.g., a parity check or cyclic redundancy check (CRC)). A detection rate (e.g., block error rate (BLER)) may be given by the rate at which a correct information vector is detected, and may be determined as a function of signal-to-noise ratio (SNR). Instances where the representation passes the error check even when it does not correctly match the original message, or where a passing error check is found without an original message (e.g., a decoding operation on a random codeword or pure noise) may be referred to as false alarms.

Techniques are described herein to terminate a list decoding operation before its completion based on performing one or more error check processes. A transmitted codeword encoded using a polar code may include one or more error check vectors interspersed with one or more information vectors. Upon receiving a decoding hypothesis for the codeword (e.g., a set of resources that corresponds to the codeword size N or a rate-matched subset of N and a number of information bits k encoded in the codeword), a decoder may perform a list decoding operation for the decoding hypothesis. Upon decoding one of the error check vectors, the decoder may determine whether at least one candidate path used in the successive cancellation list decoding operation passes an error check process based on the error check vector. If no candidate paths satisfy the error check process, the decoder may terminate the list decoding operation. In some examples, the decoder may recheck whether candidate paths satisfy the error check operation at intermediate positions between error check vectors. Such rechecking may occur during the successive cancellation list decoding process for at least one information bit location that is subsequent to the error check vector being applied according to a decoding order of the polar code. The error check vectors may be, for example, bit values determined by a parity check or CRC function of one or more preceding information vectors.

Aspects of the disclosure are initially described in the context of a wireless communications system. Aspects of the disclosure are illustrated by and described with reference to devices, encoding processes, decoding processes, and process timelines that relate to early termination of successive cancellation list decoding. Aspects of the disclosure are further illustrated by and described with reference to apparatus diagrams, system diagrams, and flowcharts that relate to early termination of successive cancellation list decoding.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TDM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an S interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, the base station may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115. Beamforming (which may also be referred to as spatial filtering or directional transmission) is a signal processing technique that may be used at a transmitter (e.g., a base station 105) to shape and/or steer an overall antenna beam in the direction of a target receiver (e.g, a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may in some cases perform packet segmentation and reassembly to communicate over logical channels. A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a network device 105-c, network device 105-b, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30,720,000$ seconds). Time resources may be organized according to radio frames of length of 10 ms ($T_f=307200T_s$), which may be identified by a system frame number (SFN) ranging from 0 to 1023. Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g, in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each orthogonal frequency-division multiplexing (OFDM) symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be.

Wireless communications system 100 may support operation on multiple cells or carriers, a feature which may be referred to as carrier aggregation (CA) or multi-carrier operation. A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both frequency division duplexing (FDD) and time division duplexing (TDD) component carriers.

In some cases, wireless communications system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration is associated with increased subcarrier spacing. A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio trequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless system 100 may utilize both licensed and unlicensed radio frequency spectrum bands. For example, wireless system 100 may employ LTE License Assisted Access (LTE-LAA) or LTE-Unlicensed (LTE-U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on FDD, TDD, or a combination of both.

In the wireless communications system 100, a base station 105 or a UE 115 may encode a message for transmission using a polar code. The resulting codeword may include one or more error check vectors interspersed with the information portions of the codeword. A base station 105 or a UE 115 that receives the codeword over a wireless communication link may use the error check vectors to determine whether a list decoding operation should be prematurely terminated. If none of the current candidate paths in the list decoding operation satisfy an error check process based on an error check vector, the decoding device may terminate the list decoding procedure immediately. Such early termination may reduce false alarm rates associated with decoding and may reduce waste of computational resources of the decoding device.

Figure 2:
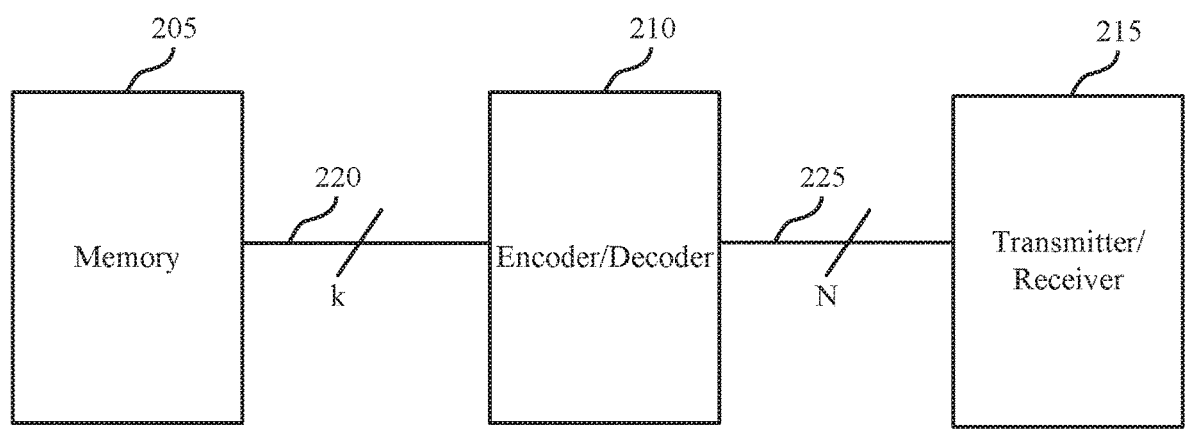
FIG. 2 illustrates an example of a device that supports early termination of successive cancellation list decoding in accordance with aspects of the present disclosure.

FIG. 2 illustrates an example of a device 200 that supports early termination of successive cancellation list decoding in accordance with various aspects of the present disclosure. In some cases, messages may be encoded using a polar code. To ensure that the correct message is decoded, an encoding device (e.g., device 200) may embed error check vectors in the codeword having bits with values determined from prior bits in a decoding order for the polar code. When decoding a decoding hypothesis for the codeword, a decoding device (e.g., device 200) may terminate a list decoding operation early if all of the surviving list decoding paths fail to pass an error check process implemented using one or more of the error check vectors embedded in the codeword. The device 200 may be any device within a wireless communications system 100 that performs an encoding or decoding process (e.g., using an error-correcting code). In some cases, such as in 5G NR systems, the error-correcting code may be an example of a polar code. The device 200 may be a UE 115 or base station 105, as described with reference to FIG. 1.

As shown, device 200 includes a memory 205, an encoder/decoder 210, and a transmitter/receiver 215. First bus 220 may connect memory 205 to encoder/decoder 210 and second bus 225 may connect encoder/decoder 210 to transmitter/receiver 215. In some instances, device 200 may have data stored in memory 205 to be transmitted to another device, such as a UE 115 or base station 105. To initiate the transmission process, device 200 may retrieve from memory 205 the data for transmission. The data may include a number of information bits, which may be 1s or 0s, provided from memory 205 to encoder/decoder 210 via first bus 220. The number of information bits may be represented as a value 'k,' as shown. The encoder/decoder 210 may encode the number of information bits and output a codeword having a length 'N,' which may be different than or the same as k. The bits that are not allocated as information bits (i.e., N−k bits) may be assigned as frozen bits or parity bits. In some cases, the information bits may be assigned to the k most reliable bit channels, and the frozen bits may be assigned to the remaining bit channels. Frozen bits may be bits of a default value (e.g., 0, 1, etc.) known to both the encoder and decoder (i.e., the encoder encoding information bits at a transmitter and the decoder decoding the codeword received at a receiver). Further, from the receiving device perspective, device 200 may receive encoded data via receiver 215, and decode the encoded data using decoder 210 to obtain the transmitted data.

In some wireless systems, decoder 210 may be an example of an SC or successive cancellation list (SCL) decoder. A UE 115 or base station 105 may receive a transmission including a codeword at receiver 215, and may send the transmission to the SC or SCL decoder (e.g., decoder 210). The decoder 210 may determine input (e.g., unpolarized) log-likelihood ratios (LLRs) for the bit channels of the received codeword. During decoding, the decoder 210 may determine decoded LLRs based on these input LLRs for each decoding path, where the decoded LLRs correspond to each polarized bit channel of the polar code. These decoded LLRs may be referred to as bit metrics. In some cases, if the LLR is zero or a positive value, the decoder 210 may determine the corresponding bit is a 0 bit, and a negative LLR may correspond to a 1 bit. The decoder 210 may use the bit metrics to determine the decoded bit values.

An SCL decoder may employ multiple concurrent SC decoding processes. Due to the combination of multiple SC decoding processes, the SCL decoder may calculate multiple decoding path candidates. For example, an SCL decoder of list size 'L' (i.e., the SCL decoder performs L SC decoding processes) may calculate L decoding path candidates, and a corresponding reliability metric (e.g., a path metric) for each decoding path candidate. The path metric may represent a reliability of a decoding path candidate or a probability that the corresponding decoding path candidate is the correct set of decoded bits. The path metric may be based on the determined bit metrics and the bit values selected at each bit channel. The SCL decoder may have a number of levels equal to the number of bit channels in the received codeword. At each level, each decoding path candidate may select either a 0 bit or a 1 bit based on a path metric of the 0 bit and the 1 bit. The SCL decoder may select a decoding path candidate based on the path metrics, and may output the bits corresponding to the selected decoding path as the decoded sets of bits. For example, the SCL decoder may select the decoding paths with the highest path metrics.

Each SC decoding process may decode the codeword sequentially (e.g., in order of the bit channel indices) due to LLR derivation dependencies. That is, because the first bit channel depends on the input LLRs and no decoded bits, each SC decoding process may first decode the bit corresponding to the first bit channel. Decoding bits for each following bit channel depends on feedback of previously decoded bits. For example, decoding the bit for the second bit channel depends on feedback from decoding the first bit channel, decoding the bit for the third bit channel depends on feedback from decoding the first and second bit channels, etc. Thus, information encoded in bit channels with lower indices are decoded earlier than information encoded in bit channels with higher indices based on the sequential nature of SC polar decoding.

In some cases, the encoder 210 may generate one or more error check vectors (e.g., a CRC) and insert the one or more error check vectors within the codeword. For example, in addition to or instead of including a single error check vector at the end of the codeword, the encoder 210 may include multiple error check vectors throughout the codeword. In some cases, the encoder 210 may use a higher number of parity bits when using this multiple parity check scheme. The encoder 210 may identify one or more locations in an information vector to insert the error check vectors and insert the error check vectors in those identified locations. An error check vector may be an example of a parity check vector, a CRC vector, a linear-feedback shift register (LFSR), or combinations thereof.

A decoder 210 at the device 200 may perform multiple error checks on the codeword throughout the decoding process. In this way, the decoder 210 may terminate a list decoding process before reaching the end of the decoding when certain conditions are met. For example, if the decoder 210 determines that none of the list decoding paths satisfy the error check processes implemented using the error check vectors, the decoder 210 may terminate the list decoding operation before reaching the end of the operation. Early termination may improve power consumption, and may reduce a false-alarm rate of a polar decoding process. A false alarm occurs when the decoder 210 identifies a message that is, in fact, not the message that was transmitted by the encoder. Said another way, if the decoder 210 determines that none of the current list decoding paths represent the original message that was transmitted, the decoder 210 may terminate the list decoding operation early. This way, the decoder 210 may not waste computational resources decoding a message it knows is incorrect. In addition, these procedures may save power in some devices. Encoding and decoding data takes power. Any reduction in the amount of time encoding and decoding information may reduce the power consumption of the device.

A device 200 decoding the codeword may perform one or more operations using at least a portion of the decoded bits before completing decoding of the entire codeword. After decoding a first set of fields (e.g., a first information vector), the device 200 may decode a first set of error check bits. In some cases, the codeword may include an adequate number of error check bits to meet targeted coding performance thresholds (e.g., a block error rate (BLER) or false-alarm rate (FAR)) for the first set of fields. Based on the first set of error check bits, the decoder 210 may determine which paths do not pass the error check. The decoder 210 may mark which paths fail to pass the error check. The decoder 210 generally does not prune paths based on the results of the error check, but rather the pruning of paths is performed at information bit locations based on path metrics (e.g., in selection of L paths from the 2L paths generated by the different bit values for the information bit location). In some examples, pruning based on the error check is not performed in order that the false alarm rate is not increased by constraining the decoding paths to valid paths. Thus, the error check may be used to determine whether the list decoding operation may be terminated early rather than for pruning purposes.

In some examples, the decoder 210 may determine whether the current list decoding paths satisfy one or more error checks at any point in the decoding operation after encountering an error check vector. In such examples, the decoder 210 may determine whether the current paths pass the error check process when decoding information bits after the error check vector in the decoding order.

Figure 3:
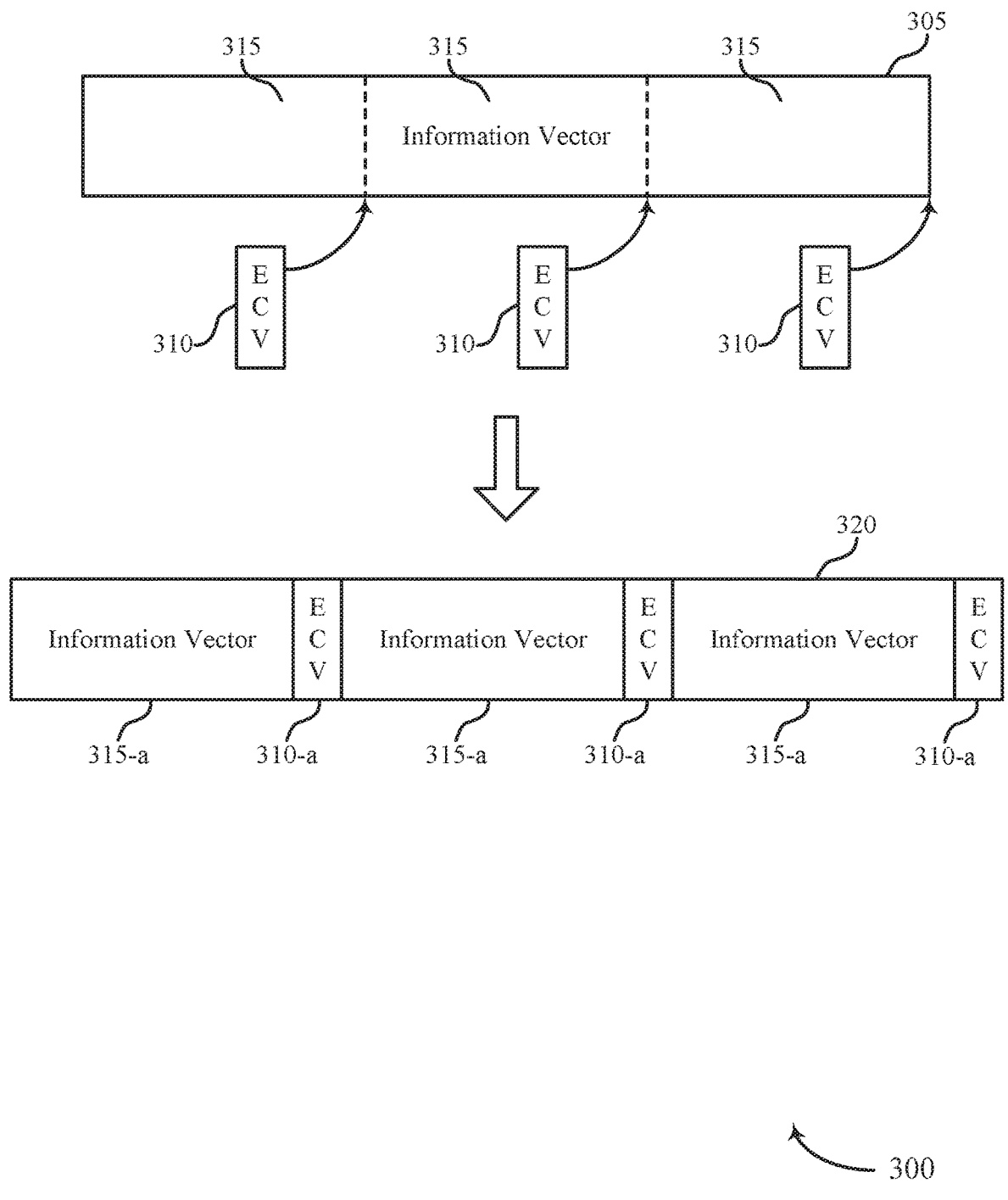
FIG. 3 illustrates an example of codeword generation that supports early termination of successive cancellation list decoding in accordance with aspects of the present disclosure.

FIG. 3 illustrates an example of codeword generation 300 that supports early termination of successive cancellation list decoding in accordance with various aspects of the present disclosure. In some examples, codeword generation 300 may implement aspects of wireless communication system 100. Codeword generation 300 illustrates encoding one or more information vectors 305 and one or more error check vectors 310 into one or more codewords using a polar code. Codeword generation 300 may be performed by a base station 105 or UE 115 as described with reference to FIG. 1, or by the device 200 as described with reference to FIG. 2.

An encoding device, such as a base station 105 or a UE 115, may have one or more payloads to transmit to a decoding device, such as a base station 105 or a UE 115. The one or more payloads may contain information vectors 305 made up of information bits that may communicate control-plane information or user-plane information. The device may encode the information vectors 305, which may correspond to DCI or UCI, for transmission within a single TTI (e.g., a slot) using a polar code. The information vector 305 may include the bits of a message to be transmitted between the base station 505 and the UE 510. The information vector 305 may include information from a single source or may include information from multiple sources. In some examples, the information vector 305 may be a single information vector that is encoded as a single block. In some examples, the information vector 305 may refer to a set of information vectors that are each encoded separately.

In some examples, the encoding device may intersperse one or more error check vectors 310 within the information vector 305 to reduce a false alarm rate of a decoding process. The error check vectors may be configured to ensure that a decoding device is decoding accurate data as transmitted by an encoding device. When a receiver receives a signal, the signal includes the transmitted data with some added noise. The added noise may cause the decoder device to misinterpret the received data. For example, a logic '1' may be transmitted, but due to added noise in the received signal, the decoder may interpret the received bit as a logic '0.' The error check vector 310 may include one or more bits having values known to both the transmitter and the receiver. Upon decoding the error check vector 310, the decoding device may cross-reference the decoded bits with the expected values that are already known to the decoder. If the decoded error check vector matches the expected values of the error check vector, the decoder may have additional confidence that the message is being decoded correctly.

In some cases, an encoding device may intersperse the one or more error check vectors 310 in the information vector 305. To reduce a false alarm rate with received codewords encoded using polar codes, the encoding device may integrate error check vectors with the information vectors (e.g., sub-vectors of the information vector 305) prior to transmitting the codeword. In some examples, to mitigate wasting computation resources, the error check vectors may be distributed at various positions with the information vector. In such examples, an error check vector may be positioned between different sets of information bits.

To intersperse the error check vectors 310, the encoding device may group the information vector 305 to portions or groups 315. These portions or groups 315 may be referred to as an information vector. The encoding device may group the information vector 305 based on the source of specific information bits, arbitrary groupings, the size of the information vector, on predetermined sizes of information vectors, predetermined locations for error check vectors, the priority of the specific information in the information vector, or combinations thereof. In some examples, the error check vectors 310 may be generated based on the information vector(s) or groups 315 that precede the error check vectors 310. In some examples, the positions of the error check vectors 310 in the information vector 305 may be predetermined in a static configuration. In some examples, the positions of the error check vectors 310 in the information vector 305 may be dynamically chosen by the encoder.

In some examples, the positions of the error check vectors 310 in the resultant vector 320 may be based on the groups of the information vector 305. For example, the error check vectors 310 may be positioned at the end of a group 315 of the information vector 305. In some examples, an error check vector 310 may be positioned at the end of the information vector 305 as a final error check. In some examples, each error check vector 310 may be a function of one or more information vectors 305 positioned the error check vector 310 in question. In some examples, the last error check vector 310 may be a function of all of the information vectors 305 in the codeword.

Once the resultant vector 320 has been generated, the encoding device may encode the resultant vector 320 with a polar code. The resultant vector 320 may include any number of error check vectors 310 (e.g., zero, one, two, three, four, five, six, seven, eight, etc.).

In some examples, an encoder may encode a single codeword for all information bits of a TT (e.g., a slot). For example, if an encoder has multiple payloads to encode for transmission in a single TI (e.g., if the total information bits are made up of multiple sets of information bits, each set corresponding to a different payload), the encoder may concatenate the multiple payloads into a single joint payload (e.g., information vector 305). The encoder may encode the joint payload into a single codeword. Using a single codeword rather than multiple smaller codewords in the TTI may improve BLER coding performance and may allow a decoder to perform fewer decoding hypotheses. A single codeword may include multiple error check vectors separating fields of data (e.g., information vectors or groups 315).

Figure 4:
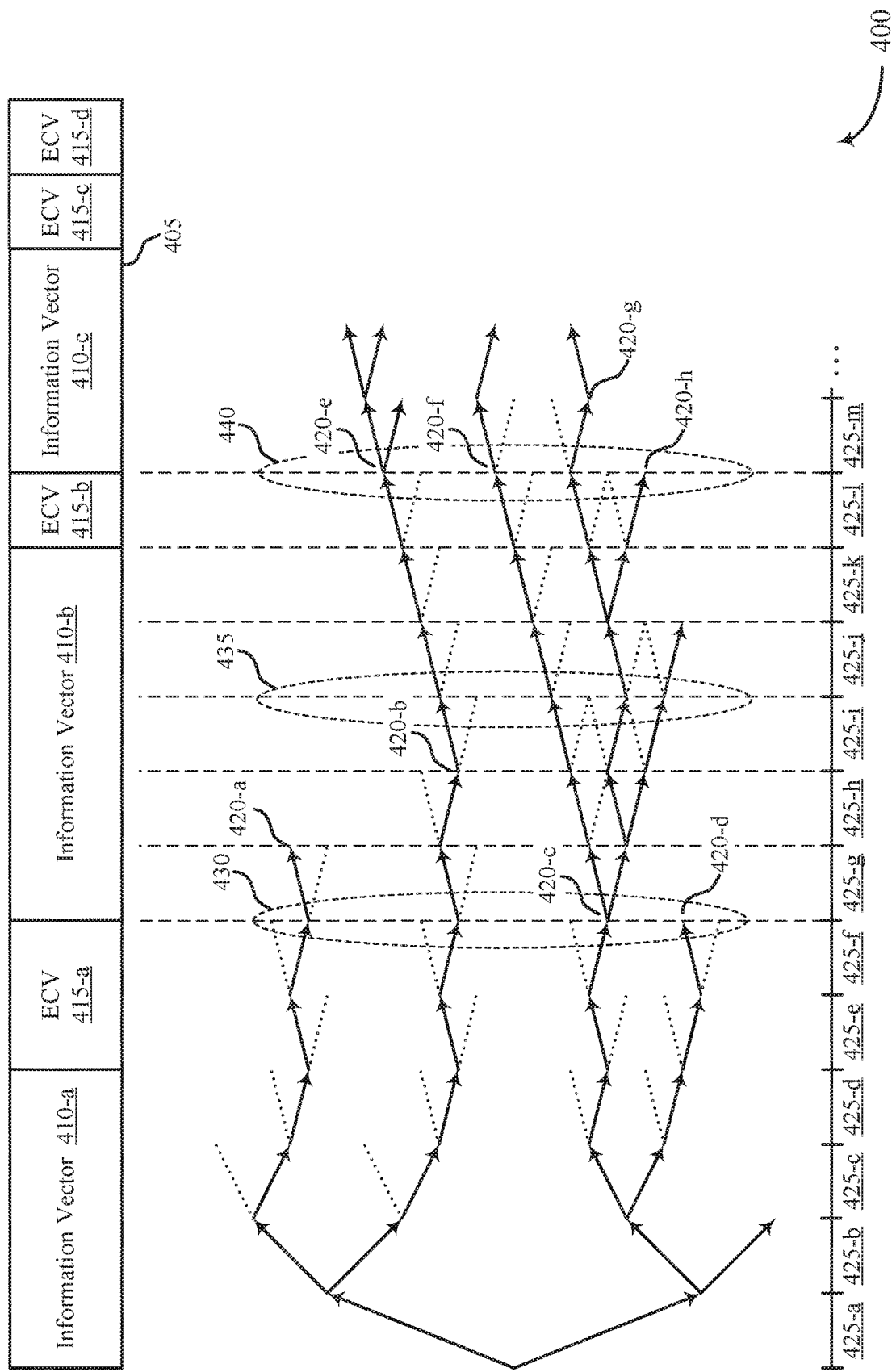
FIG. 4 illustrates an example of a decoding process that supports early termination of successive cancellation list decoding in accordance with aspects of the present disclosure.

FIG. 4 illustrates an example of a decoding process 400 that supports early termination of successive cancellation list decoding in accordance with various aspects of the present disclosure. In some examples, the decoding process 400 may implement aspects of wireless communication system 100. The decoding process 400 may be performed by a base station 105, a UE 115, or a device 200 as described with reference to FIGS. 1 and 2. For example, the decoding process 400 may be performed by an SCL decoder of list size L=4, with L list decoding paths 420. The decoding process 400 may be represented by a binary tree, where each branch in the tree represents assigning a decoded bit to a bit channel for a decoding path. In some cases, each upwards branch may represent assigning a 0 for a bit channel, while the corresponding downward branch may represent assigning a 1 for that bit channel. In such cases, list decoding path 420-$h$ may represent the assigned bits 100101101011 for the first twelve information and parity bit channels of the codeword.

In some cases, the decoding process may be an example of decoding bit channels of a codeword 405 encoded using a polar code. The codeword 405 may be organized with one or more error check vectors 415 interspersed with one or more information vectors 410. In some examples, the bit value(s) of the error check vectors 415 may be generated using a function that depends on the bits of one or more information vectors 410 that precede the specific error check vector 415. For example, the error check vector 415-$a$ may be based on the information vector 410-$a$, the error check vector 415-$b$ may be based on the information vector 410-$b$, etc. In some examples, each error check vector 415 may be a function of one or more information vectors 410 positioned prior to the error check vector 415 in question. For examples, the error check vector 415-$b$ may be a function of the first information vector 410-$a$ and the second information vector 410-$b$. The codeword 405 may also include error check vector 415-$d$ which may be generated using a function that depends on the bits of all of the information vectors 410-$a$, 410-$b$, and 410-$c$, and which may be located at the end of the codeword. In some cases, the codeword may not include error check vector 415-$c$ for a last information portion, and instead the last data information vector 410-$c$ may be followed by the error check vector 415-$d$ based on the bits for all of the fields in the codeword. The information vectors 410 and error check vectors 415 shown may illustrate an organization of information bits used to encode the codeword, and may not show other aspects of encoding process, such as frozen bit placement. In some cases, the information vectors 410 may be examples of the information vectors 305, 315 described with reference to FIG. 3. In some cases, the error check vectors 415 may be examples of the error check vectors 310 described with reference to FIG. 3.

As an SCL decoder of list size L=4, the decoder may concurrently process (e.g, maintain after processing each information bit) four candidate paths. Following decoding of the first error check vector 415-$a$ at bit channel 425-$g$, the SCL decoder may check for any candidate paths that do not pass the error detecting check. The SCL decoder may mark which candidate paths pass the error detecting check. In some examples, the SCL decoder may mark which candidate paths do not pass the error detecting check. The SCL decoder may select surviving candidate paths independent of the results of the error detecting check that uses the error check vectors 415. The selection of surviving list decoding paths 420 may be based on path metrics and may include propagating any markings about the error check process to any child list decoding paths. At any point in the list decoding operation after the first error check vector 415-$a$, the SCL decoder may terminate the list decoding operation early, if none of the surviving list decoding paths 420 pass of the one or more error check operations associated with error check vectors 415.

The decoding device may perform a list decoding operation on the first information vector 410-$a$ of a decoding candidate (e.g., codeword 405) encoded using a polar code. During the list decoding operation, the decoding device may obtain a first set 430 of list decoding paths 420 that is based on the first information vector 410-$a$ and the first error check vector 415-$a$ at bit channel 425-$g$. In some examples, the decoded bits for each list decoding path 420 in the first set 430 is different. The first set 430 of list decoding paths 420 may include a number of list decoding paths that are equal to the list size of the SCL decoder (e.g., L=4).

At bit channel 425-$g$, the SCL decoder may perform an error check process based on the first error check vector 415-$a$. The error check process may include comparing the bit values at bit channels 425-$f$ and 425-$g$ for each list decoding path 420 of the first set 430 to expected bit values. Because bit channels 425-$f$ and 425-$g$ correspond to the first error check vector 415-$a$, the SCL decoder can determine expected bit values for those bit channels based on the decoded bit values for bit channels 425-$a$ through 425-$f$ for the decoding paths. If the decoded bit values at bit channels 425-$f$ and 425-$g$ for a particular list decoding path 420 are equal to the expected bit values, the SCL decoder may determine that the particular list decoding path passes the error check process. In some examples, a list decoding path may be referred to as a candidate path.

If the SCL decoder determines that none of the list decoding paths 420 of the first set 430 satisfy the error check process, the SCL decoder may terminate the list decoding operation immediately. When a list decoding path 420 fails to satisfy the error check process, such a result may indicate that the list decoding path 420 is not an accurate representation of the data transmitted by the encoder. The SCL decoder receives a codeword that includes data and noise. The noise may cause introduce errors into the received codeword when compared to the transmitted codeword. Failing an error check process may indicate a likelihood that the failing list decoding path does not accurately reflect the bits that were transmitted. If none of the list decoding paths 420 in the first set 430 pass the error check process, it may indicate that all of the list decoding paths 420 of the first 430 do not accurately represent the data that was transmitted. Instead of using computational resources on decoding operations that will not produce a successfully decoded message, the SCL decoder may terminate the list decoding procedure before reaching the end of the list decoding procedure. In many cases, however, some of the all of the list decoding paths may satisfy the error check process. In such cases, the SCL decoder may continue performing the list decoding operation.

In some cases, upon determining that at least one list decoding path of the first set 430 satisfies the error check process, the SCL decoder may mark the at least one list decoding path. Marking the list decoding paths may include toggling a bit associated with a given decoding path indicating that the error check process was passed. In some examples, the SCL decoder may mark the list decoding paths that do not satisfy the error check process rather than those that do.

Independent of the results of the error check process, the SCL decoder may select L list decoding paths to survive to bit channel 425-$h$ based on the path metrics of the list decoding paths in the first set 430. As such, the SCL decoder may prune the candidate paths that have the lowest path metrics. For example, if the number of paths in an SCL decoder is four, the SCL decoder will prune all but the four paths with the best path metrics. For example, at bit channel 425-$g$, the SCL decoder may prune a list decoding path 420-$d$ due to insufficient path metrics, while allowing list decoding paths 420-$a$, 420-$b$, and two list decoding paths from 420-$c$ advance to bit channel 425-$h$.

In some of the marking cases, the SCL decoder may propagate the marking of the list decoding paths 420 of the first set 430 that satisfy the error check process to their surviving child list decoding paths. For example, if list decoding path 420-$c$ satisfied the error check process associated with the first error check vector 415-$a$, the SCL decoder may mark the list decoding path 420-$c$ as passing. Accordingly, both list decoding paths that branch from the list decoding path 420-$c$ at bit channel 425-$h$ may be marked as passing the first error check process associated with the first error check vector 415-$a$.

After determining that at least one of the list decoding paths 420 satisfies the first error check process, the SCL decoder may continue the list decoding operation by moving to bit channel 425-$h$. The SCL decoder may continue with typical list decoding operations by pruning candidate paths that have the lowest path metrics.

The SCL decoder may determine whether surviving list decoding paths satisfy the first error check process at one or more points after bit channel 425-$g$. For example, while processing bit channels 425 associated with the second information vector 410-$b$ (e.g., bit channels 425-$h$ through 425-$k$), the SCL decoder may make determinations about whether the surviving list decoding paths satisfy the first error check process. Through the process of pruning list decoding paths whose path metrics are the lowest path metrics, the SCL decoder may prune the descendants of list decoding paths that pass the first error check process. By checking whether current list decoding paths 420 satisfy the first error check process at intermediate locations, the SCL decoder conserve power, free computational resources for other processes, and/or avoid using communication resources on a list decoding operation that may not yield a correct result. In some examples, these operations may mitigate false alarms.

The SCL decoder may recheck the first error check process at intermediate locations using a variety of procedures. In some instances, at bit channel 425-$j$, the SCL decoder may determine whether any of the current list decoding paths 420 of a second set 435 have been marked based on the results of the first error check process. For example, if list decoding path 420-$c$ was marked as passing the first error check process and list decoding path 420-$b$ was not marked because it failed the first error check process, the SCL decoder may determine that three of the four list decoding paths in the second set 435 pass the first error check process. This is because three for the four list decoding paths in the second set 435 are descendants of the list decoding path 420-$c$ and one of the four list decoding paths in the second set 435 is a descendant of the list decoding path 420-$b$. Using the marking may be possible because the marking may be propagated to children list decoding paths of the list decoding paths of the first set 430 In other instances, the SCL decoder may perform the first error check again on the list decoding paths of the second set 435, rather than check a marking.

The SCL decoder may determine whether list decoding paths satisfy the first error check process at any bit channel after the first error check vector 415-$a$. In some examples, the SCL decoder may make this determination at every bit channel after the first error check vector 415-$a$. In some examples, the SCL decoder may make this determination at discrete intermediate locations (e.g., every other bit channel or every third bit channel). Although described above that a first error checking process for the first error check value 415-$a$ is performed at bit channel 425-$g$, in some examples the first error checking process using the first error check value 415-$a$ may be performed after bit channel 425-$g$. That is, one or more additional bit channels 425 may be processed before the first error checking process using the first error check value 415-$a$ is performed.

If the SCL decoder determines at any time that all of the list decoding paths 420 fail to satisfy the first error check process, the SCL decoder may terminate the list decoding operation immediately. Rechecking the first error check process at intermediate locations during decoding may yield a more efficient use of computational resources of the SCL decoder than not rechecking.

After decoding bit channels associated with the second information vector 410-$b$ and the second error check vector 415-$b$, the SCL decoder the SCL decoder may perform a second error check process based on the second error check vector 415-$b$ at bit channel 425-$m$. The second error check process may include comparing the bit values at bit channel 425-*m* for each list decoding path 420 of a third set 440 to an expected bit value. Because the bit channel 425-*m* corresponds to the second error check vector 415-*b*, the SCL decoder may be capable of determining expected bit values for the bit channel. If the decoded bit value at bit channel 425-*m* for a particular list decoding path 420 is equal to the expected bit value, the SCL decoder may determine that the particular list decoding path passes the second error check process. The second error check process may be an example of the first error check process that uses the second error check vector 415-*b* rather than the first error check vector 415-*a*. The second error check vector 415-*b* has a different vector length (e.g., one bit) than the first error check vector 415-*a* (e.g., two bits). The error check vectors 415 may be any bit length (e.g., one, two, three, four, five, six, seven, eight, etc.).

The SCL decoder may terminate the list decoding procedure prematurely if all of the list decoding paths 420 of the third set 440 fail the second error check process. In some examples, the SCL decoder may terminate the list decoding procedure only if all of the list decoding paths 420 of the third set 440 fail the first error check process and the second error check process. In some cases, the SCL decoder may mark whether the list decoding paths 420 of the third set 440 satisfy the second error check process. The SCL decoder may test whether surviving list decoder paths satisfy the second error check process and/or the first error check process at intermediate bit channels after the second error check vector 415-*b*.

Such error check processes and intermediate testing of error check process may continue to occur for each error check vector 415 in the decoding candidate. The positions for intermediate testing occur at locations that correspond to sub-channels of information vectors.

Figure 5:
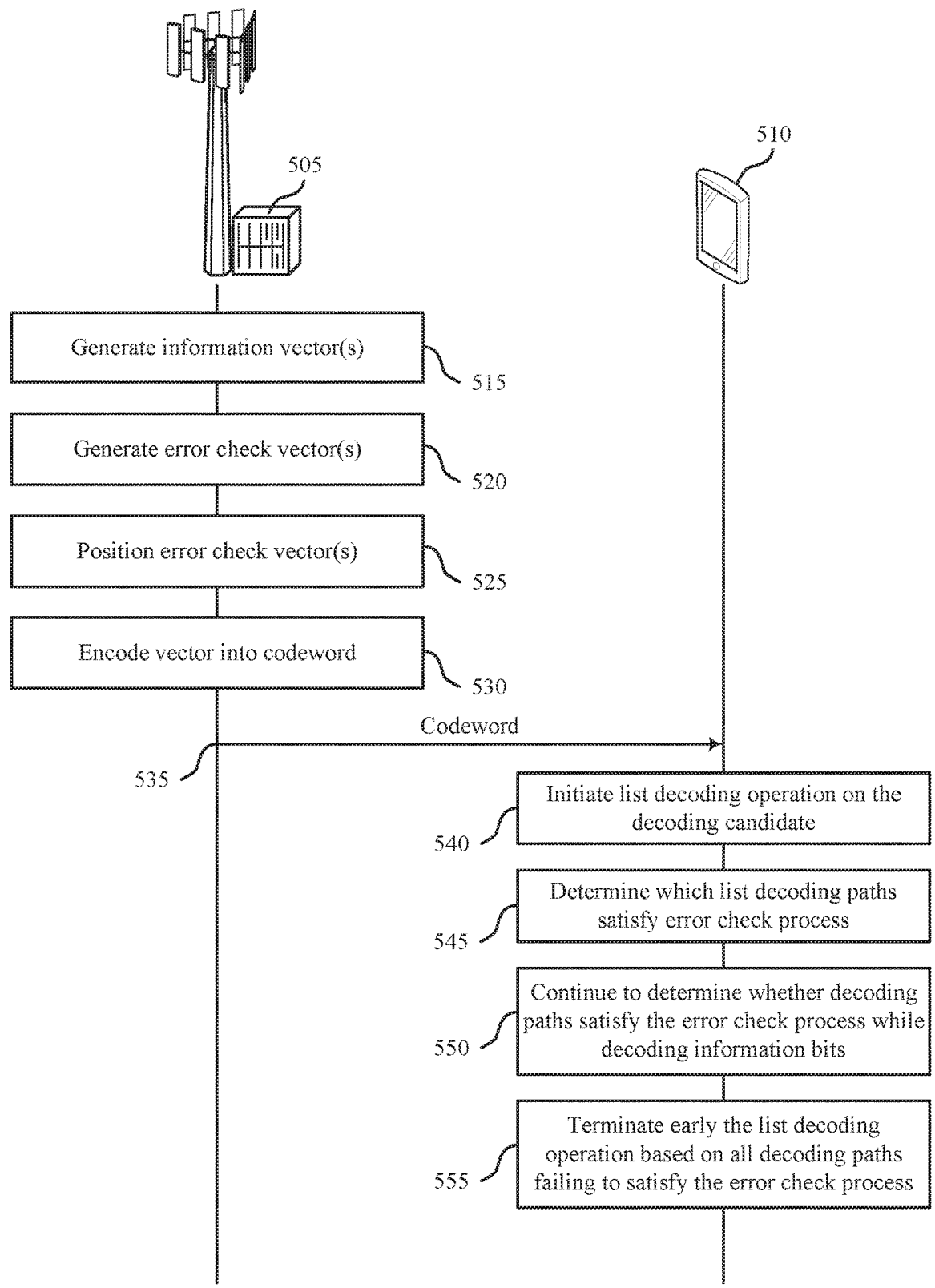
FIG. 5 illustrates an example of a process timeline that supports early termination of successive cancellation list decoding in accordance with aspects of the present disclosure.

FIG. 5 illustrates an example of a process timeline 500 that supports early termination of successive cancellation list decoding in accordance with various aspects of the present disclosure. The process timeline 500 shows encoding and decoding operations that use error check vectors interspersed with information vectors in the codeword. Such interspersed error check vectors may be used to terminate a list decoding process early in the event that all of the current list decoding paths fail the parity checks.

In some examples, the process timeline 500 may implement aspects of wireless communication system 100. The process timeline 500 may illustrate communications between a base station 505 and a UE 510. While the process timeline 500 illustrates processes in a downlink context, the functions of the process timeline 500 may be implemented in an uplink context. In such uplink contexts, the functions of the base station 505 may be performed by the UE 510 and vice versa. The base station 505 may be an example of the base stations 105 or the device 200 described with reference to FIGS. 1 and 2. The UE 510 may be an example of the UEs 115 or the device 200 described with reference to FIGS. 1 and 2.

At block 515, the base station 505 may generate one or more information vectors for the codeword. The information vector may include the bits of a message to be transmitted from the base station 505 to the UE 510. The information vector may include control information and/or user information to communicate to the UE 510.

At block 520, the base station 505 may generate error check vectors for the codeword. The error check vectors may be configured to ensure that a decoding device is decoding accurate data as transmitted by an encoding device. The error check vectors may be based on data in the related information vectors.

At block 525, the base station 505 may position the one or more error check vectors in the one or more information vectors. By interspersing one or more error check vectors in the one or more information vectors, the base station 505 may reduce a false alarm rate associated with a received codeword and/or mitigate wasting computation resources performing list decoding operations that will likely yield inaccurate results. The base station 505 may position the one or more error check vectors at various locations within or between the one or more information vectors.

At block 530, the base station 505 may encode the resultant vector that includes the one or more information vectors and the error check vectors into a codeword. The vector may be encoded using a polar code. In some examples, the base station 505 may encode the information vector before inserting the error check vectors. The base station 505 may transmit the codeword 535 to the UE 510 over a wireless communication link of a wireless communication system. The UE 510 may receive the codeword 535 with some added noise.

At block 540, the UE 510 may initiate a list decoding operation on a decoding list candidate based on the received codeword 535. As part of the initiation, the UE 510 may monitor for a decoding candidate of a codeword encoded according to a polar code, wherein the decoding candidate is based at least in part on a first information vector, a second information vector, and a first error check vector positioned between the first information vector and the second information vector according to a decoding order of the polar code. The UE 510 may perform a list decoding operation on a first portion of sub-channels of the decoding candidate corresponding to the first information vector and the first error check vector to obtain a first set of list decoding paths.

At block 545, the UE 510 may determine, for the first set of list decoding paths, that at least one list decoding path of the first set of list decoding paths satisfies a first error check process using respective decoding path candidates for the first error check vector and the first information vector. In some cases, the UE 510 may mark which list decoding paths pass the first error check process. After performing the first error check process, the UE 510 may perform the list decoding operation on a second portion of the sub-channels of the decoding candidate corresponding to at least a subset of the second information vector to obtain a second set of list decoding paths that are based at least in part on the first set of list decoding paths.

At block 550, the UE 510 may continue to determine whether decoding paths satisfy the error check process while decoding information bits of the decoding candidate. In such examples, the UE 510 may check to see if the list decoding paths still satisfy the first error check process at intermediate positions between a first error check vector and a second error check vector.

At block 555, the UE 510 may terminate, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate. Such an early termination may be based on a determination that none of the results of the current decoding paths will yield an accurate representation of the transmitted data.

Figure 6:
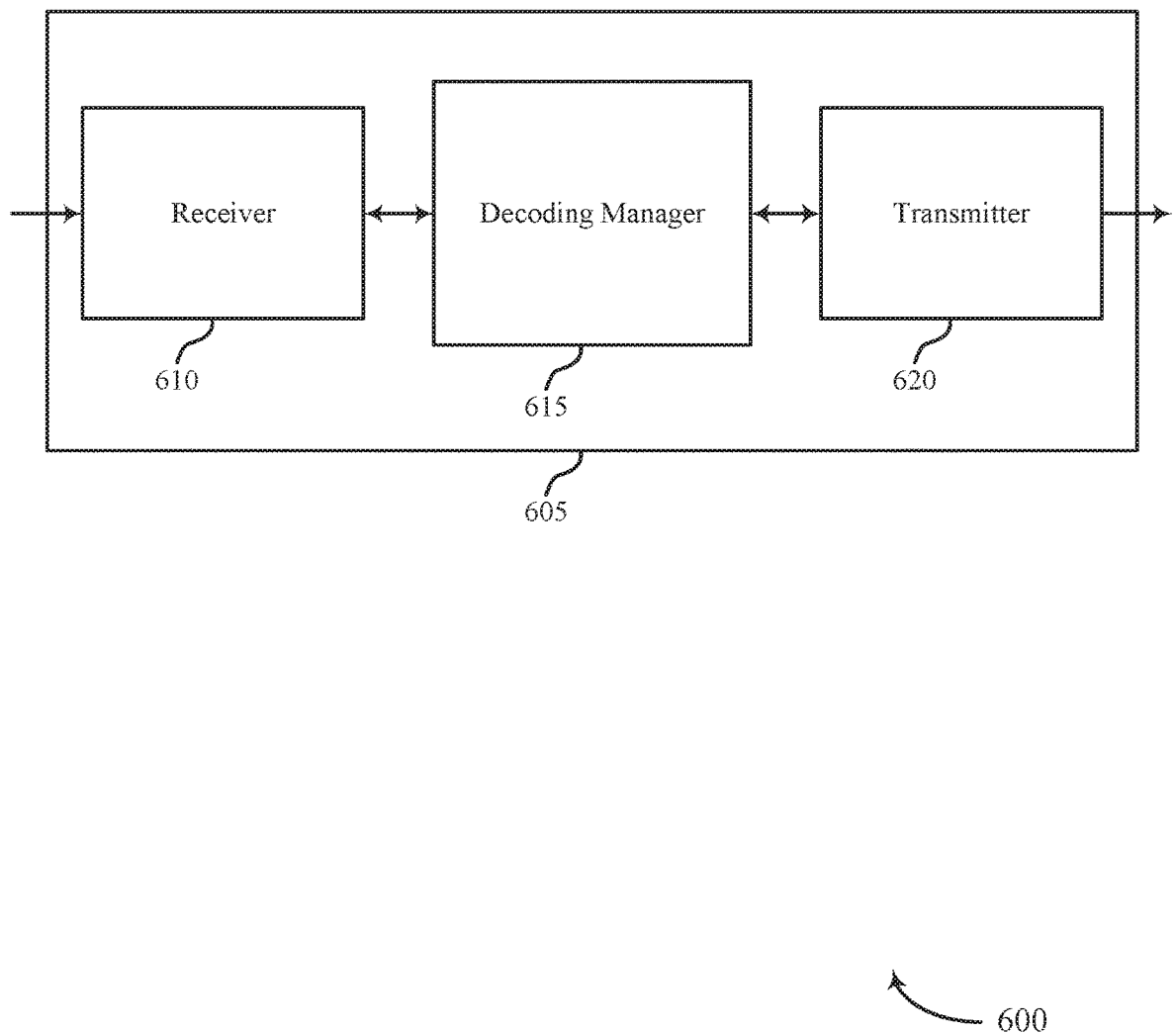
FIGS. 6 through 8 show block diagrams of a device that supports early termination of successive cancellation list decoding in accordance with aspects of the present disclosure.

FIG. 6 shows a block diagram 600 of a wireless device 605 that supports early termination of successive cancellation list decoding in accordance with aspects of the present disclosure. Wireless device 605 may be an example of aspects of a UE 115 or base station 105 as described herein. Wireless device 605 may include receiver 610, decoding manager 615, and transmitter 620. Wireless device 605 may also include a processor. Each of these components may be in communication with one another (e.g., via one or more buses).

Receiver 610 may receive information such as packets, user data, or control information associated with various information channels (e.g., control channels, data channels, and information related to early termination of successive cancellation list decoding, etc.). Information may be passed on to other components of the device. The receiver 610 may be an example of aspects of the transceiver 935 described with reference to FIG. 9. The receiver 610 may utilize a single antenna or a set of antennas.

Receiver 610 may monitor, at a UE, for a decoding candidate of a codeword encoded according to a polar code, where the decoding candidate is based on a first information vector, a second information vector, and a first error check vector positioned between the first information vector and the second information vector according to a decoding order of the polar code.

Decoding manager 615 may be an example of aspects of the decoding manager 915 described with reference to FIG. 9. Decoding manager 615 and/or at least some of its various sub-components may be implemented in hardware, software executed by a processor, firmware, or any combination thereof. If implemented in software executed by a processor, the functions of the decoding manager 615 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The decoding manager 615 and/or at least some of its various sub-components may be physically located at various positions, including being distributed such that portions of functions are implemented at different physical locations by one or more physical devices. In some examples, decoding manager 615 and/or at least some of its various sub-components may be a separate and distinct component in accordance with various aspects of the present disclosure. In other examples, decoding manager 615 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

Decoding manager 615 may perform a list decoding operation on a first portion of sub-channels of the decoding candidate corresponding to the first information vector and the first error check vector to obtain a first set of list decoding paths, determine, for the first set of list decoding paths, that at least one list decoding path of the first set of list decoding paths satisfies a first error check process using respective decoding path candidates for the first error check vector and the first information vector, perform the list decoding operation on a second portion of the sub-channels of the decoding candidate corresponding to at least a subset of the second information vector to obtain a second set of list decoding paths that are based on the first set of list decoding paths, and determine whether at least one of the second set of decoding paths satisfy the first error check process.

Transmitter 620 may transmit signals generated by other components of the device. In some examples, the transmitter 620 may be collocated with a receiver 610 in a transceiver module. For example, the transmitter 620 may be an example of aspects of the transceiver 935 described with reference to FIG. 9. The transmitter 620 may utilize a single antenna or a set of antennas.

Figure 7:
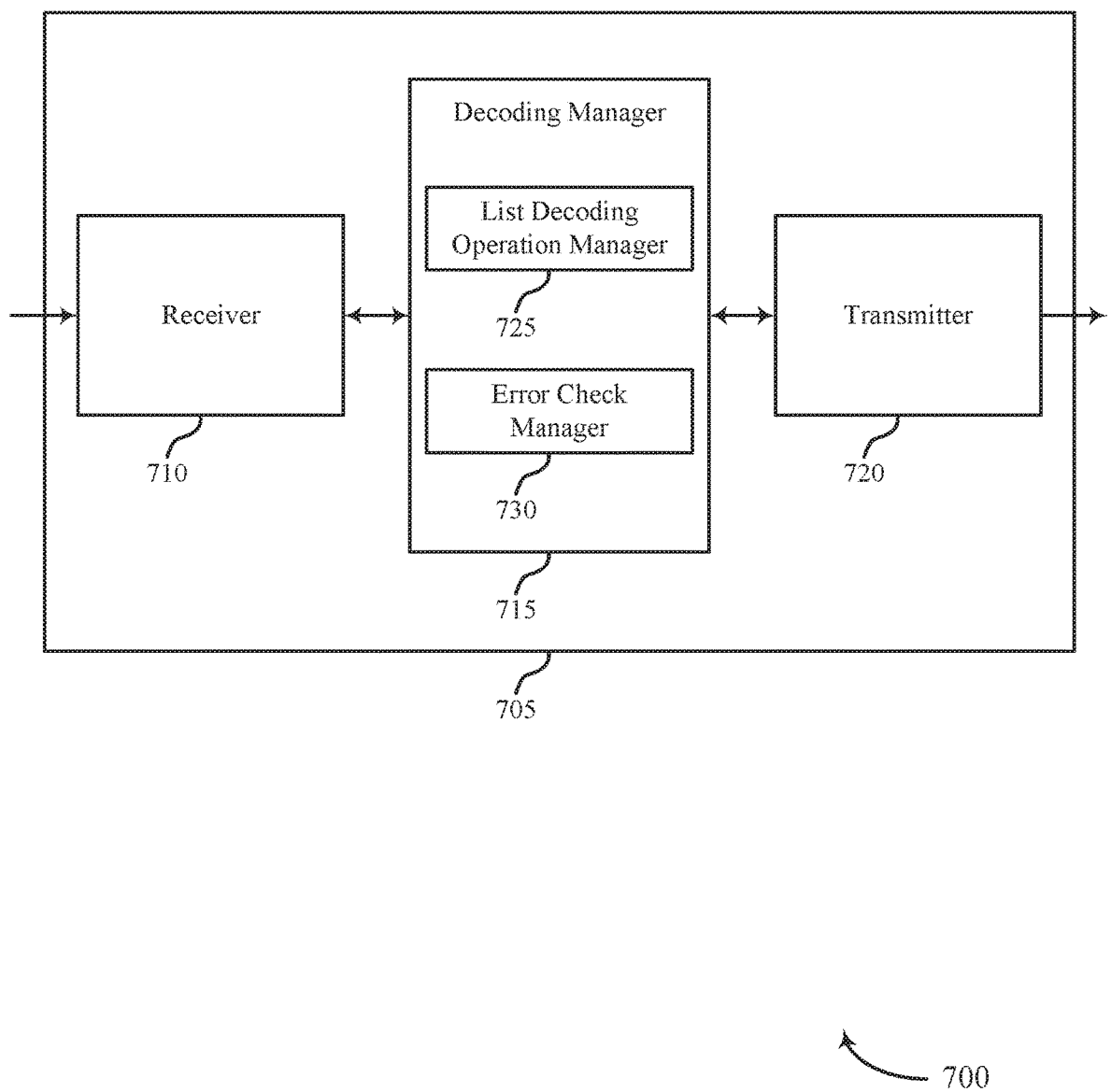

FIG. 7 shows a block diagram 700 of a wireless device 705 that supports early termination of successive cancellation list decoding in accordance with aspects of the present disclosure. Wireless device 705 may be an example of aspects of a wireless device 605 or a UE 115 or base station 105 as described with reference to FIG. 6. Wireless device 705 may include receiver 710, decoding manager 715, and transmitter 720. Wireless device 705 may also include a processor. Each of these components may be in communication with one another (e.g., via one or more buses).

Receiver 710 may receive information such as packets, user data, or control information associated with various information channels (e.g., control channels, data channels, and information related to early termination of successive cancellation list decoding, etc.). Information may be passed on to other components of the device. The receiver 710 may be an example of aspects of the transceiver 935 described with reference to FIG. 9. The receiver 710 may utilize a single antenna or a set of antennas.

Decoding manager 715 may be an example of aspects of the decoding manager 915 described with reference to FIG. 9. Decoding manager 715 may also include list decoding operation manager 725 and error check manager 730.

List decoding operation manager 725 may perform a list decoding operation on a first portion of sub-channels of the decoding candidate corresponding to the first information vector and the first error check vector to obtain a first set of list decoding paths, perform the list decoding operation on a second portion of the sub-channels of the decoding candidate corresponding to at least a subset of the second information vector to obtain a second set of list decoding paths that are based on the first set of list decoding paths, perform the list decoding operation on a third portion of the sub-channels of the decoding candidate corresponding to the first information vector, the second information vector, the first error check vector, and a second error check vector to obtain a third set of list decoding paths, the second error check vector positioned after the second information vector, and perform the list decoding operation on a fourth portion of the sub-channels of the decoding candidate corresponding to at least a subset of a third information vector positioned after the second error check vector to obtain a fourth set of list decoding paths that are based on the third set of list decoding paths.

Error check manager 730 may determine, for the first set of list decoding paths, that at least one list decoding path of the first set of list decoding paths satisfies a first error check process using respective decoding path candidates for the first error check vector and the first information vector, determine whether at least one of the second set of decoding paths satisfy the first error check process, determine, for the third set of list decoding paths, that at least one list decoding path of the third set of list decoding paths satisfies both the first error check process and a second error check process using respective decoding path candidates for the first information vector, the first error check vector, the second information vector, and the second error check vector, determine whether at least one of the fourth set of list decoding paths satisfies the first error check process and the second error check process, and perform the first error check process using the first error check vector on the second set of decoding paths as part of performing the list decoding operation on the second portion of the sub-channels of the decoding candidate corresponding to at least the subset of the second information vector, where determining whether at least one of the second set of decoding paths satisfies the first error check process is based on performing the first error check process while performing the list decoding operation on the second portion of the sub-channels of the decoding candidate. In some cases, the determining whether at least one of the second set of decoding paths satisfy the first error check process occurs at a set of intermediate locations of the second portion of the sub-channels of the decoding candidate corresponding to at least the subset of the second information vector. In some cases, the set of intermediate locations corresponds to each sub-channel of the second portion of the sub-channels of the decoding candidate.

Transmitter 720 may transmit signals generated by other components of the device. In some examples, the transmitter 720 may be collocated with a receiver 710 in a transceiver module. For example, the transmitter 720 may be an example of aspects of the transceiver 935 described with reference to FIG. 9. The transmitter 720 may utilize a single antenna or a set of antennas.

Figure 8:
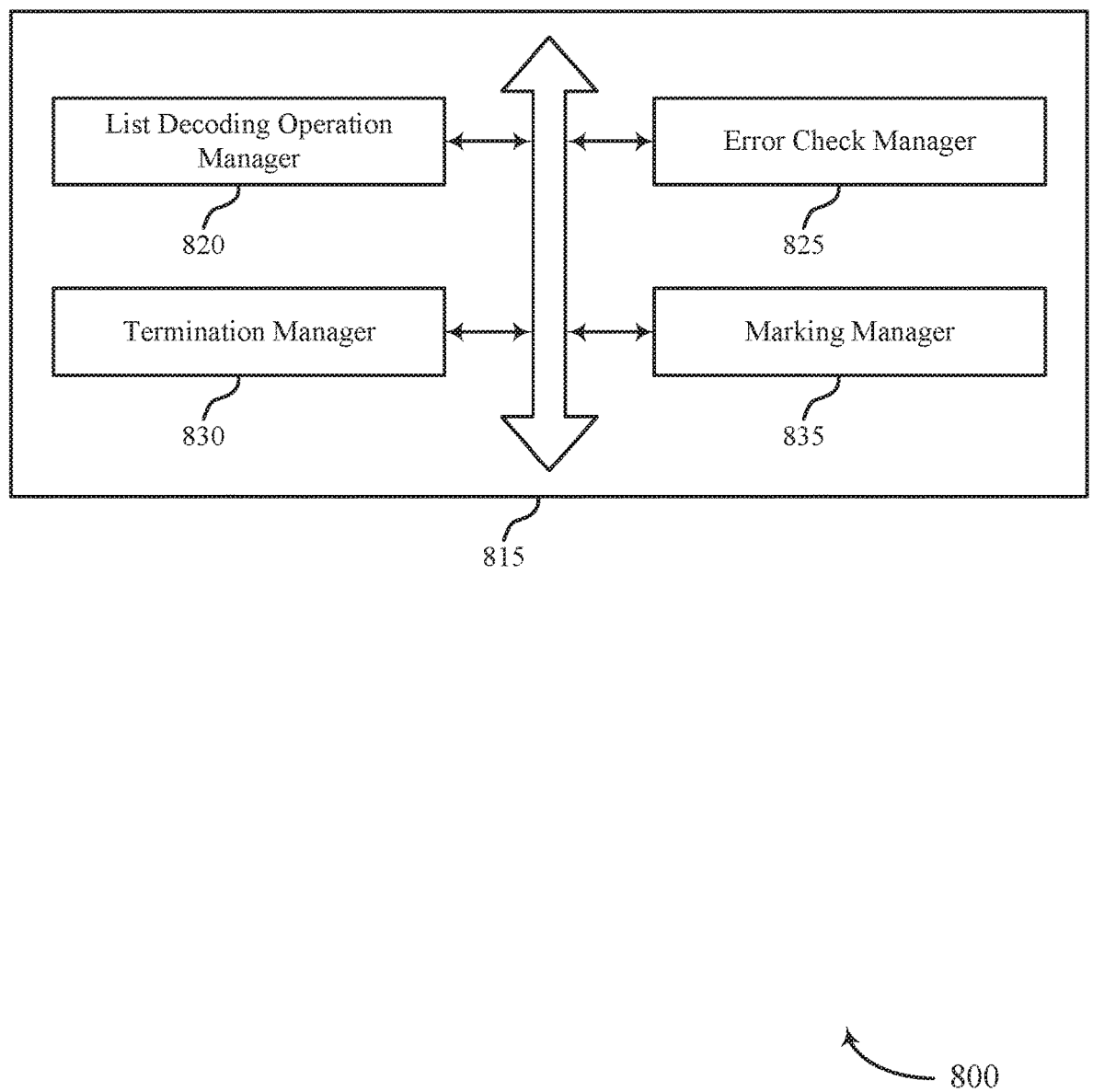

FIG. 8 shows a block diagram 800 of a decoding manager 815 that supports early termination of successive cancellation list decoding in accordance with aspects of the present disclosure. The decoding manager 815 may be an example of aspects of a decoding manager 615, a decoding manager 715, or a decoding manager 915 described with reference to FIGS. 6, 7, and 9. The decoding manager 815 may include list decoding operation manager 820, error check manager 825, termination manager 830, and marking manager 835. Each of these modules may communicate, directly or indirectly, with one another (e.g., via one or more buses).

List decoding operation manager 820 may perform a list decoding operation on a first portion of sub-channels of the decoding candidate corresponding to the first information vector and the first error check vector to obtain a first set of list decoding paths, perform the list decoding operation on a second portion of the sub-channels of the decoding candidate corresponding to at least a subset of the second information vector to obtain a second set of list decoding paths that are based on the first set of list decoding paths, perform the list decoding operation on a third portion of the sub-channels of the decoding candidate corresponding to the first information vector, the second information vector, the first error check vector, and a second error check vector to obtain a third set of list decoding paths, the second error check vector positioned after the second information vector, and perform the list decoding operation on a fourth portion of the sub-channels of the decoding candidate corresponding to at least a subset of a third information vector positioned after the second error check vector to obtain a fourth set of list decoding paths that are based on the third set of list decoding paths.

Error check manager 825 may determine, for the first set of list decoding paths, that at least one list decoding path of the first set of list decoding paths satisfies a first error check process using respective decoding path candidates for the first error check vector and the first information vector, determine whether at least one of the second set of decoding paths satisfy the first error check process, determine, for the third set of list decoding paths, that at least one list decoding path of the third set of list decoding paths satisfies both the first error check process and a second error check process using respective decoding path candidates for the first information vector, the first error check vector, the second information vector, and the second error check vector, determine whether at least one of the fourth set of list decoding paths satisfies the first error check process and the second error check process, and perform the first error check process using the first error check vector on the second set of decoding paths as part of performing the list decoding operation on the second portion of the sub-channels of the decoding candidate corresponding to at least the subset of the second information vector, where determining whether at least one of the second set of decoding paths satisfies the first error check process is based on performing the first error check process while performing the list decoding operation on the second portion of the sub-channels of the decoding candidate. In some cases, the determining whether at least one of the second set of decoding paths satisfy the first error check process occurs at a set of intermediate locations of the second portion of the sub-channels of the decoding candidate corresponding to at least the subset of the second information vector. In some cases, the set of intermediate locations corresponds to each sub-channel of the second portion of the sub-channels of the decoding candidate.

Termination manager 830 may terminate, prior to completion of the list decoding operation on the decoding candidate of the codeword, the list decoding operation based on a failure of the first error check process for all of the second set of list decoding paths determined while performing the list decoding operation on the second portion of the sub-channels of the decoding candidate and terminate, prior to completion of the list decoding operation on the decoding candidate of the codeword, the list decoding operation based on a failure of the first error check process and a failure of the second error check process for all of the fourth set of list decoding paths determined while performing the list decoding operation on the fourth portion of the sub-channels of the decoding candidate.

Marking manager 835 may mark the at least one list decoding path of the first set of list decoding paths that satisfies the first error check process using the first error check vector, where determining whether at least one of the second set of decoding paths satisfy the first error check process is based on the marking of the at least one list decoding path and propagate the marking of the at least one list decoding path to child list decoding paths as part of performing the list decoding operation on the second portion of the sub-channels of the decoding candidate, where each child list decoding path associated with the second portion of the sub-channels of the decoding candidate includes an indication of whether the child list decoding path was marked during the first error check process.

Figure 9:
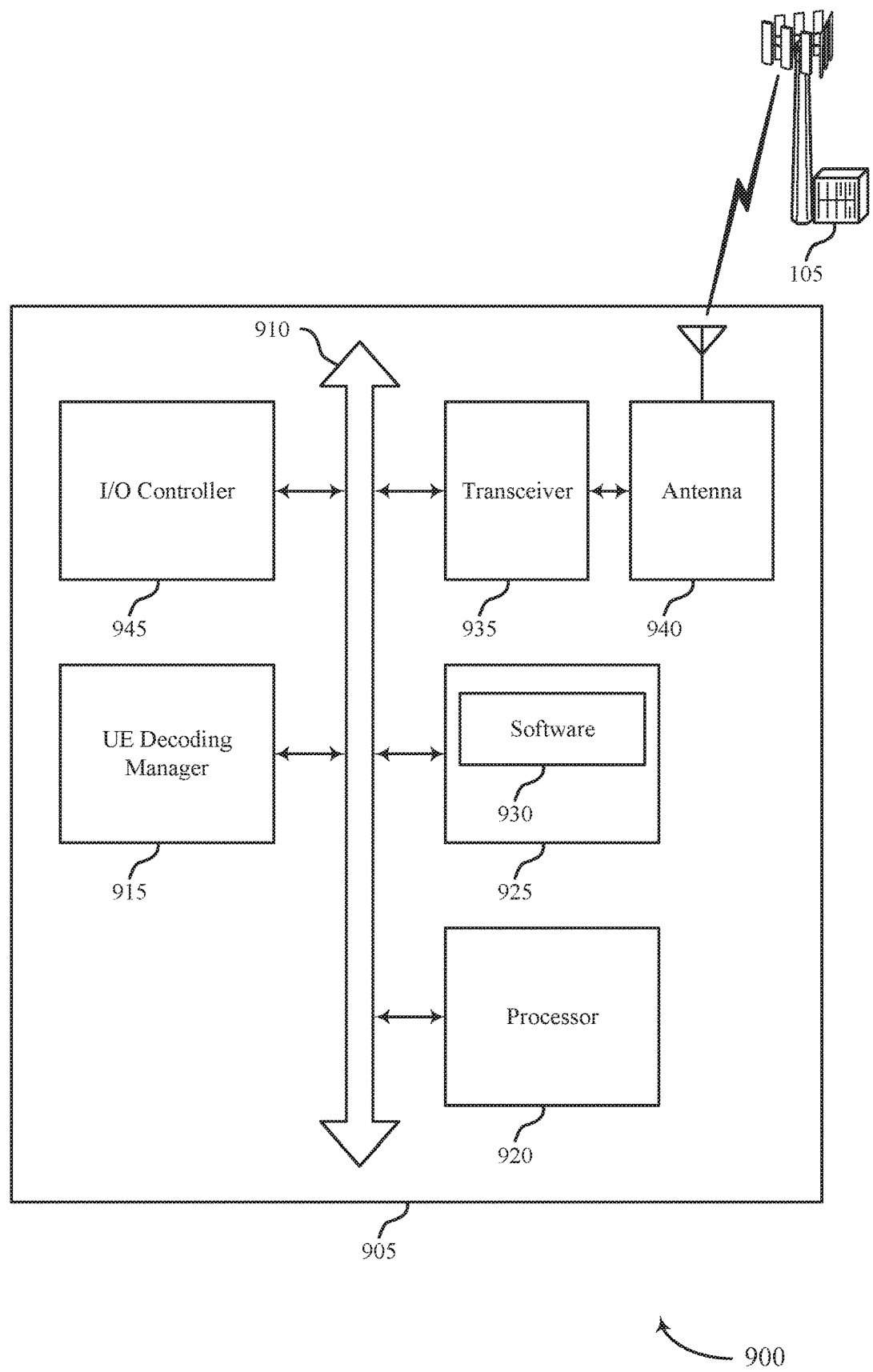
FIG. 9 illustrates a block diagram of a system including a UE that supports early termination of successive cancellation list decoding in accordance with aspects of the present disclosure.

FIG. 9 shows a diagram of a system 900 including a device 905 that supports early termination of successive cancellation list decoding in accordance with aspects of the present disclosure. Device 905 may be an example of or include the components of wireless device 605, wireless device 705, or a UE 115 as described above, e.g., with reference to FIGS. 6 and 7. Device 905 may include components for bi-directional voice and data communications including components for transmitting and receiving communications, including UE decoding manager 915, processor 920, memory 925, software 930, transceiver 935, antenna 940, and I/O controller 945. These components may be in electronic communication via one or more buses (e.g., bus 910). Device 905 may communicate wirelessly with one or more base stations 105.

Processor 920 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 920 may be configured to operate a memory array using a memory controller. In other cases, a memory controller may be integrated into processor 920. Processor 920 may be configured to execute computer-readable instructions stored in a memory to perform various functions (e.g., functions or tasks supporting early termination of successive cancellation list decoding).

Memory 925 may include random access memory (RAM) and read only memory (ROM). The memory 925 may store computer-readable, computer-executable software 930 including instructions that, when executed, cause the processor to perform various functions described herein. In some cases, the memory 925 may contain, among other things, a basic input/output system (BIOS) which may control basic hardware or software operation such as the interaction with peripheral components or devices.

Software 930 may include code to implement aspects of the present disclosure, including code to support early termination of successive cancellation list decoding. Software 930 may be stored in a non-transitory computer-readable medium such as system memory or other memory. In some cases, the software 930 may not be directly executable by the processor but may cause a computer (e.g., when compiled and executed) to perform functions described herein.

Transceiver 935 may communicate bi-directionally, via one or more antennas, wired, or wireless links as described above. For example, the transceiver 935 may represent a wireless transceiver and may communicate bi-directionally with another wireless transceiver. The transceiver 935 may also include a modem to modulate the packets and provide the modulated packets to the antennas for transmission, and to demodulate packets received from the antennas.

In some cases, the wireless device may include a single antenna 940. However, in some cases the device may have more than one antenna 940, which may be capable of concurrently transmitting or receiving multiple wireless transmissions.

I/O controller 945 may manage input and output signals for device 905. I/O controller 945 may also manage peripherals not integrated into device 905. In some cases, I/O controller 945 may represent a physical connection or port to an external peripheral. In some cases, I/O controller 945 may utilize an operating system such as iOS®, ANDROID®, MS-DOS®, MS-WINDOWS®, OS/2®, UNIX®, LINUX®, or another known operating system. In other cases, I/O controller 945 may represent or interact with a modem, a keyboard, a mouse, a touchscreen, or a similar device. In some cases, I/O controller 945 may be implemented as part of a processor. In some cases, a user may interact with device 905 via I/O controller 945 or via hardware components controlled by I/O controller 945.

Figure 10:
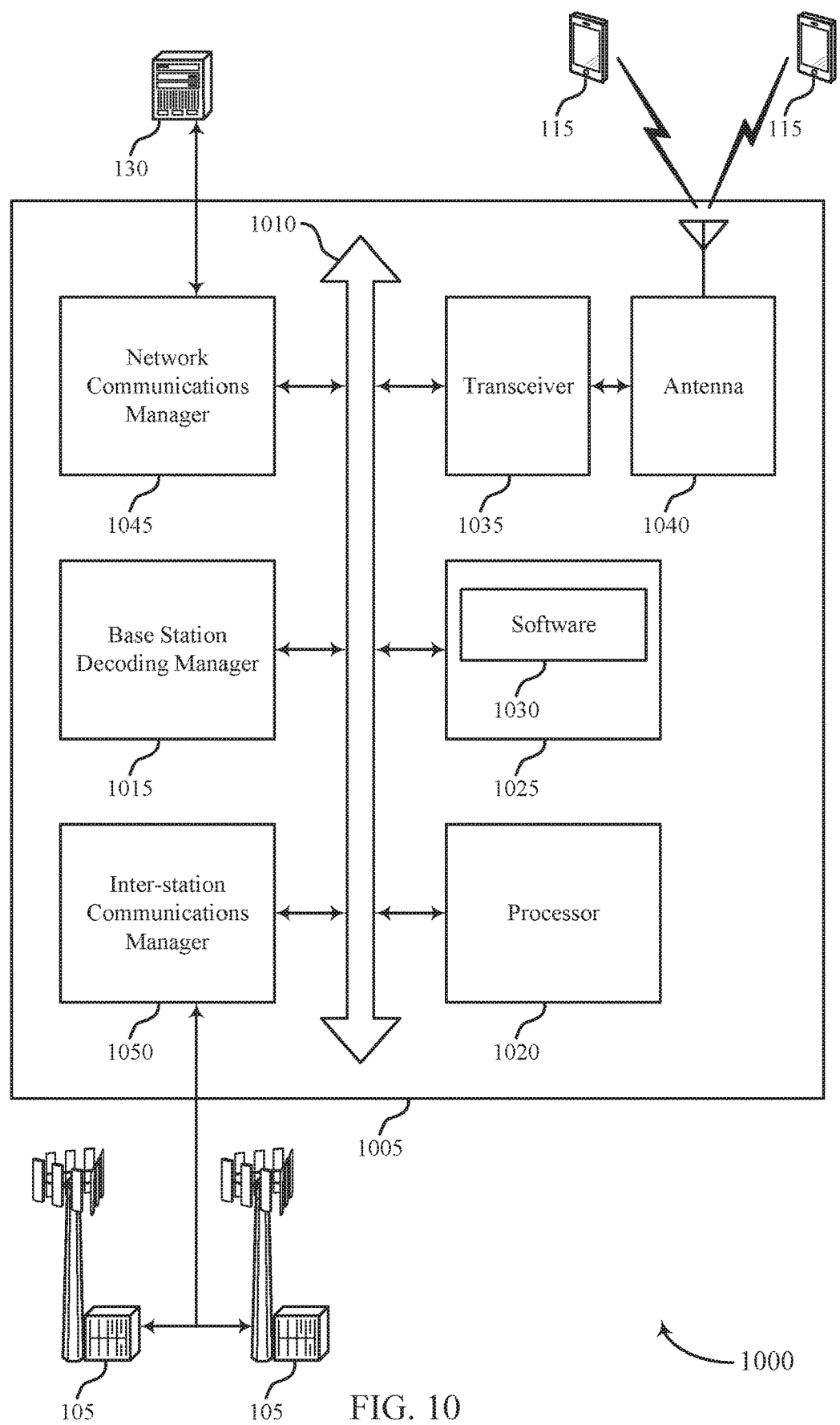
FIG. 10 illustrates a block diagram of a system including a base station that supports early termination of successive cancellation list decoding in accordance with aspects of the present disclosure.

FIG. 10 shows a diagram of a system 1000 including a device 1005 that supports early termination of successive cancellation list decoding in accordance with aspects of the present disclosure. Device 1005 may be an example of or include the components of wireless device 705, wireless device 805, or a base station 105 as described above, e.g., with reference to FIGS. 7 and 8. Device 1005 may include components for bi-directional voice and data communications including components for transmitting and receiving communications, including base station decoding manager 1015, processor 1020, memory 1025, software 1030, transceiver 1035, antenna 1040, network communications manager 1045, and inter-station communications manager 1050. These components may be in electronic communication via one or more buses (e.g., bus 1010). Device 1005 may communicate wirelessly with one or more UEs 115.

Processor 1020 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 1020 may be configured to operate a memory array using a memory controller. In other cases, a memory controller may be integrated into processor 1020. Processor 1020 may be configured to execute computer-readable instructions stored in a memory to perform various functions (e.g., functions or tasks supporting early termination of successive cancellation list decoding).

Memory 1025 may include RAM and ROM. The memory 1025 may store computer-readable, computer-executable software 1030 including instructions that, when executed, cause the processor to perform various functions described herein. In some cases, the memory 1025 may contain, among other things, a BIOS which may control basic hardware or software operation such as the interaction with peripheral components or devices.

Software 1030 may include code to implement aspects of the present disclosure, including code to support early termination of successive cancellation list decoding. Software 1030 may be stored in a non-transitory computer-readable medium such as system memory or other memory. In some cases, the software 1030 may not be directly executable by the processor but may cause a computer (e.g., when compiled and executed) to perform functions described herein.

Transceiver 1035 may communicate bi-directionally, via one or more antennas, wired, or wireless links as described above. For example, the transceiver 1035 may represent a wireless transceiver and may communicate bi-directionally with another wireless transceiver. The transceiver 1035 may also include a modem to modulate the packets and provide the modulated packets to the antennas for transmission, and to demodulate packets received from the antennas.

In some cases, the wireless device may include a single antenna 1040. However, in some cases the device may have more than one antenna 1040, which may be capable of concurrently transmitting or receiving multiple wireless transmissions.

Network communications manager 1045 may manage communications with the core network (e.g., via one or more wired backhaul links). For example, the network communications manager 1045 may manage the transfer of data communications for client devices, such as one or more UEs 115.

Inter-station communications manager 1050 may manage communications with other base station 105, and may include a controller or scheduler for controlling communications with UEs 115 in cooperation with other base stations 105. For example, the inter-station communications manager 1050 may coordinate scheduling for transmissions to UEs 115 for various interference mitigation techniques such as beamforming or joint transmission. In some examples, inter-station communications manager 1050 may provide an X2 interface within an Long Term Evolution (LTE)/LTE-A wireless communication network technology to provide communication between base stations 105.

Figure 11:
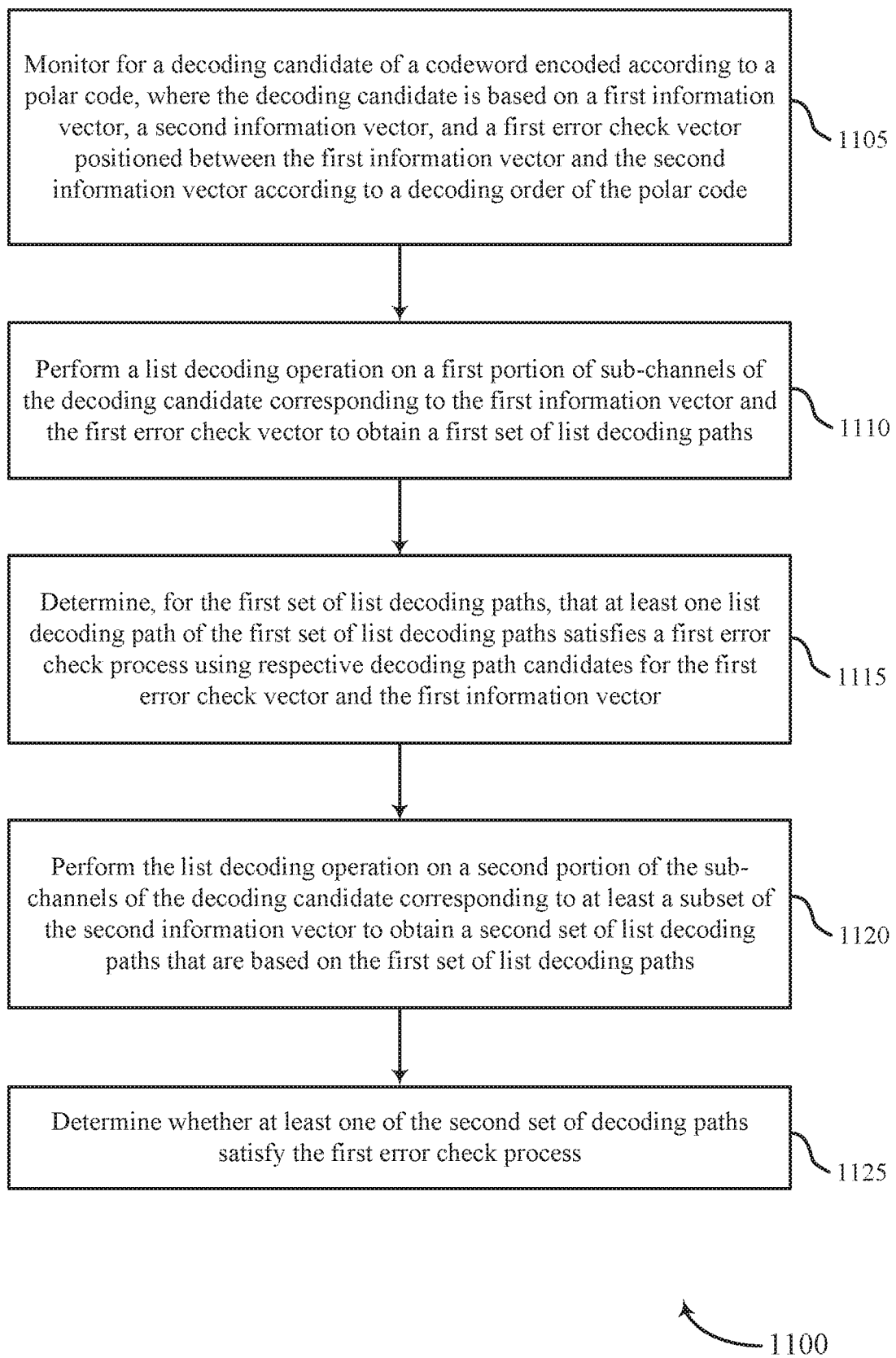
FIGS. 11 through 13 illustrate methods for early termination of successive cancellation list decoding in accordance with aspects of the present disclosure.

FIG. 11 shows a flowchart illustrating a method 1100 for early termination of successive cancellation list decoding in accordance with aspects of the present disclosure. The operations of method 1100 may be implemented by a UE 115 or base station 105 or its components as described herein. For example, the operations of method 1100 may be performed by a decoding manager as described with reference to FIGS. 6 through 8. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1105 the UE 115 or base station 105 may monitor for a decoding candidate of a codeword encoded according to a polar code, wherein the decoding candidate is based at least in part on a first information vector, a second information vector, and a first error check vector positioned between the first information vector and the second information vector according to a decoding order of the polar code. The operations of block 1105 may be performed according to the methods described herein. In certain examples, aspects of the operations of block 1105 may be performed by a receiver as described with reference to FIGS. 6 through 8.

At block 1110 the UE 115 or base station 105 may perform a list decoding operation on a first portion of sub-channels of the decoding candidate corresponding to the first information vector and the first error check vector to obtain a first set of list decoding paths. The operations of block 1110 may be performed according to the methods described herein. In certain examples, aspects of the operations of block 1110 may be performed by a list decoding operation manager as described with reference to FIGS. 6 through 8.

At block 1115 the UE 115 or base station 105 may determine, for the first set of list decoding paths, that at least one list decoding path of the first set of list decoding paths satisfies a first error check process using respective decoding path candidates for the first error check vector and the first information vector. The operations of block 1115 may be performed according to the methods described herein. In certain examples, aspects of the operations of block 1115 may be performed by an error check manager as described with reference to FIGS. 6 through 8.

At block 1120 the UE 115 or base station 105 may perform the list decoding operation on a second portion of the sub-channels of the decoding candidate corresponding to at least a subset of the second information vector to obtain a second set of list decoding paths that are based at least in part on the first set of list decoding paths. The operations of block 1120 may be performed according to the methods described herein. In certain examples, aspects of the operations of block 1120 may be performed by a list decoding operation manager as described with reference to FIGS. 6 through 8.

At block 1125 the UE 115 or base station 105 may determine whether at least one of the second set of decoding paths satisfy the first error check process. The operations of block 1125 may be performed according to the methods described herein. In certain examples, aspects of the operations of block 1125 may be performed by an error check manager as described with reference to FIGS. 6 through 8.

Figure 12:
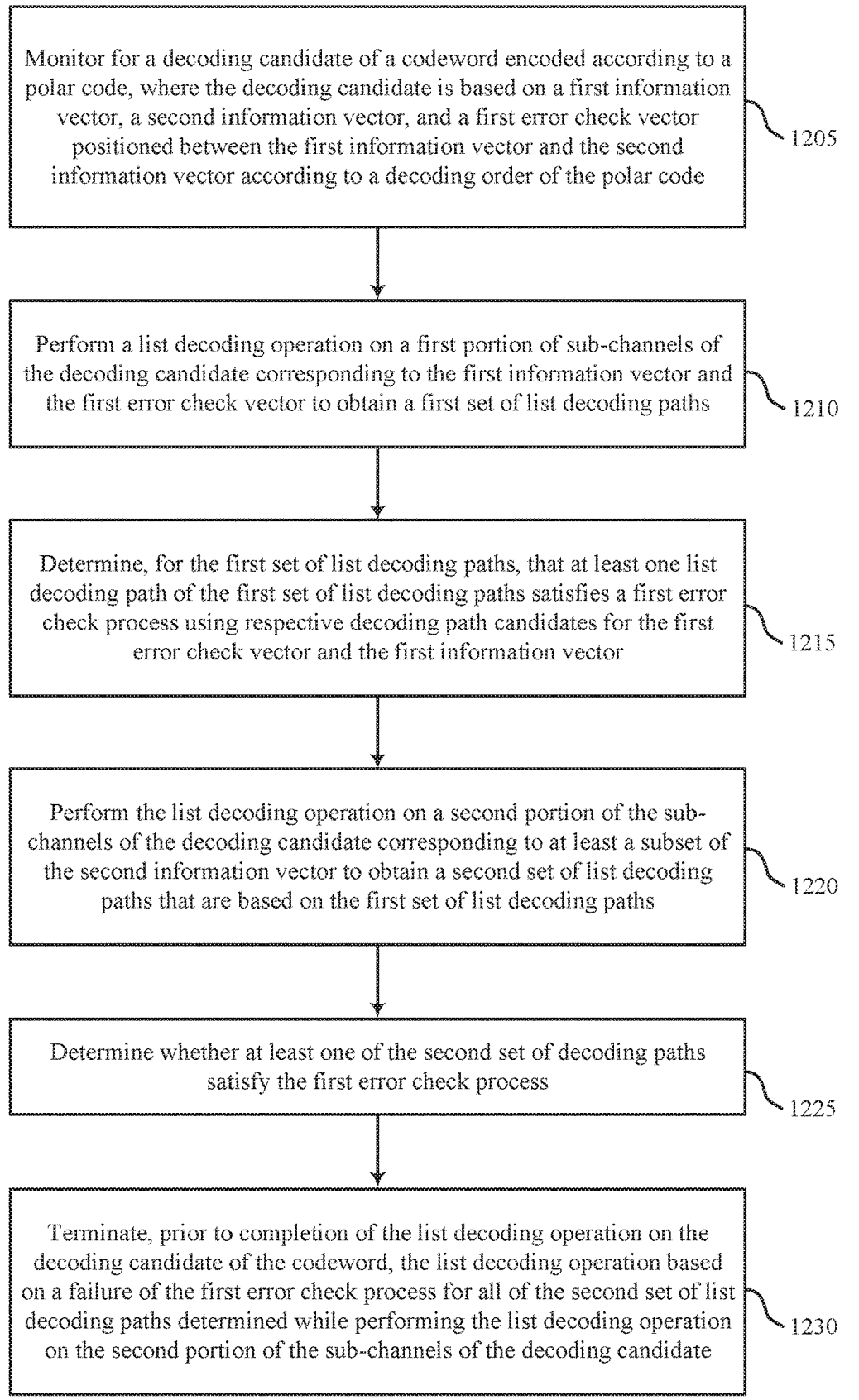

FIG. 12 shows a flowchart illustrating a method 1200 for early termination of successive cancellation list decoding in accordance with aspects of the present disclosure. The operations of method 1200 may be implemented by a UE 115 or base station 105 or its components as described herein. For example, the operations of method 1200 may be performed by a decoding manager as described with reference to FIGS. 6 through 8. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1205 the UE 115 or base station 105 may monitor for a decoding candidate of a codeword encoded according to a polar code, wherein the decoding candidate is based at least in part on a first information vector, a second information vector, and a first error check vector positioned between the first information vector and the second information vector according to a decoding order of the polar code. The operations of block 1205 may be performed according to the methods described herein. In certain examples, aspects of the operations of block 1205 may be performed by a receiver as described with reference to FIGS. 6 through 8.

At block 1210 the UE 115 or base station 105 may perform a list decoding operation on a first portion of sub-channels of the decoding candidate corresponding to the first information vector and the first error check vector to obtain a first set of list decoding paths. The operations of block 1210 may be performed according to the methods described herein. In certain examples, aspects of the operations of block 1210 may be performed by a list decoding operation manager as described with reference to FIGS. 6 through 8.

At block 1215 the UE 115 or base station 105 may determine, for the first set of list decoding paths, that at least one list decoding path of the first set of list decoding paths satisfies a first error check process using respective decoding path candidates for the first error check vector and the first information vector. The operations of block 1215 may be performed according to the methods described herein. In certain examples, aspects of the operations of block 1215 may be performed by an error check manager as described with reference to FIGS. 6 through 8.

At block 1220 the UE 115 or base station 105 may perform the list decoding operation on a second portion of the sub-channels of the decoding candidate corresponding to at least a subset of the second information vector to obtain a second set of list decoding paths that are based at least in part on the first set of list decoding paths. The operations of block 1220 may be performed according to the methods described herein. In certain examples, aspects of the operations of block 1220 may be performed by a list decoding operation manager as described with reference to FIGS. 6 through 8.

At block 1225 the UE 115 or base station 105 may determine whether at least one of the second set of decoding paths satisfy the first error check process. The operations of block 1225 may be performed according to the methods described herein. In certain examples, aspects of the operations of block 1225 may be performed by an error check manager as described with reference to FIGS. 6 through 8.

At block 1230 the UE 115 or base station 105 may terminate, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate. The operations of block 1230 may be performed according to the methods described herein. In certain examples, aspects of the operations of block 1230 may be performed by a termination manager as described with reference to FIGS. 6 through 8.

Figure 13:
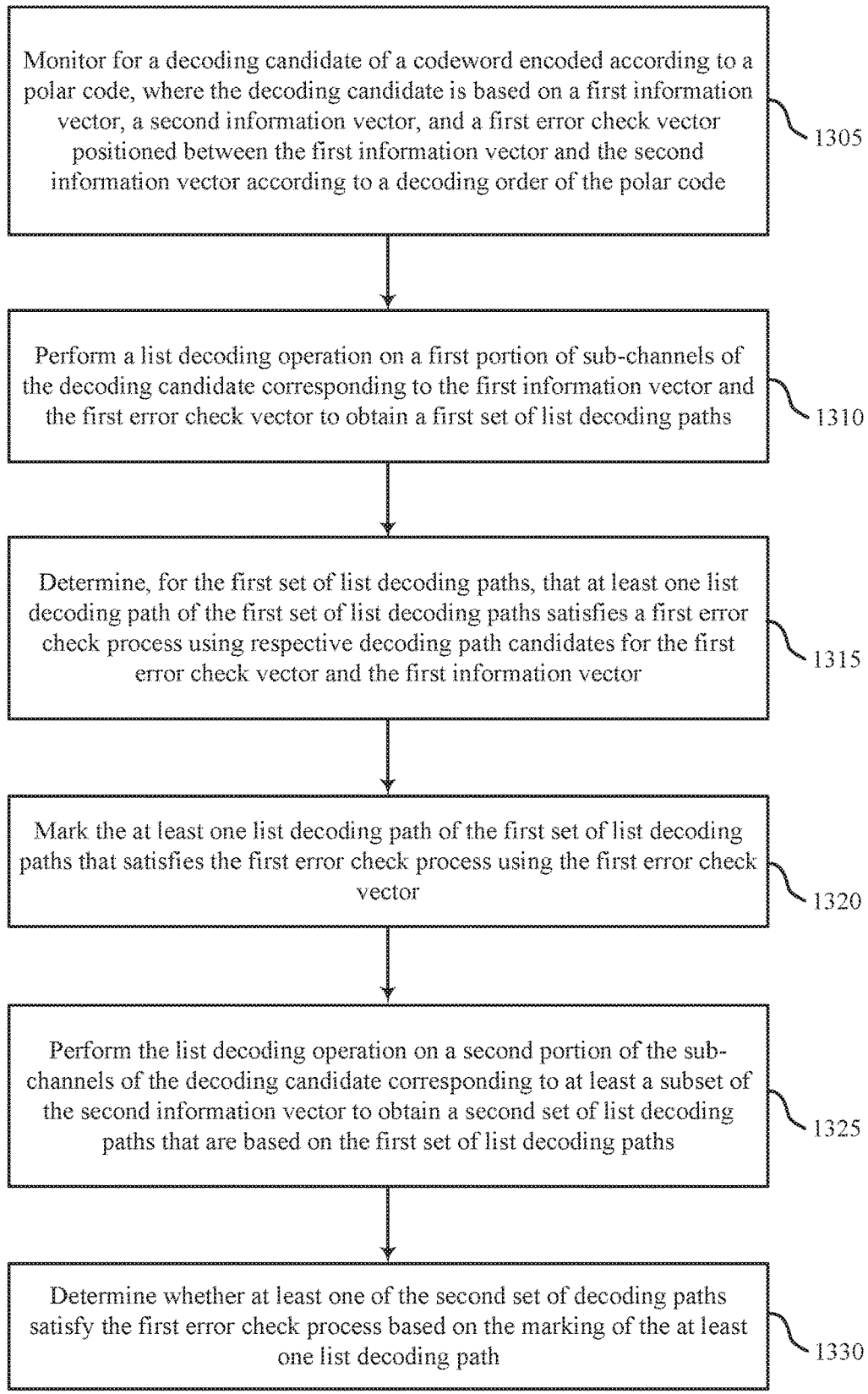

FIG. 13 shows a flowchart illustrating a method 1300 for early termination of successive cancellation list decoding in accordance with aspects of the present disclosure. The operations of method 1300 may be implemented by a UE 115 or base station 105 or its components as described herein. For example, the operations of method 1300 may be performed by a decoding manager as described with reference to FIGS. 6 through 8. In some examples, a UE 115 or base station 105 may execute a set of codes to control the functional elements of the device to perform the functions described below. Additionally or alternatively, the UE 115 or base station 105 may perform aspects of the functions described below using special-purpose hardware.

At block 1305 the UE 115 or base station 105 may monitor for a decoding candidate of a codeword encoded according to a polar code, wherein the decoding candidate is based at least in part on a first information vector, a second information vector, and a first error check vector positioned between the first information vector and the second information vector according to a decoding order of the polar code. The operations of block 1305 may be performed according to the methods described herein. In certain examples, aspects of the operations of block 1305 may be performed by a receiver as described with reference to FIGS. 6 through 8.

At block 1310 the UE 115 or base station 105 may perform a list decoding operation on a first portion of sub-channels of the decoding candidate corresponding to the first information vector and the first error check vector to obtain a first set of list decoding paths. The operations of block 1310 may be performed according to the methods described herein. In certain examples, aspects of the operations of block 1310 may be performed by a list decoding operation manager as described with reference to FIGS. 6 through 8.

At block 1315 the UE 115 or base station 105 may determine, for the first set of list decoding paths, that at least one list decoding path of the first set of list decoding paths satisfies a first error check process using respective decoding path candidates for the first error check vector and the first information vector. The operations of block 1315 may be performed according to the methods described herein. In certain examples, aspects of the operations of block 1315 may be performed by an error check manager as described with reference to FIGS. 6 through 8.

At block 1320 the UE 115 or base station 105 may mark the at least one list decoding path of the first set of list decoding paths that satisfies the first error check process using the first error check vector. The operations of block 1320 may be performed according to the methods described herein. In certain examples, aspects of the operations of block 1320 may be performed by a marking manager as described with reference to FIGS. 6 through 8.

At block 1325 the UE 115 or base station 105 may perform the list decoding operation on a second portion of the sub-channels of the decoding candidate corresponding to at least a subset of the second information vector to obtain a second set of list decoding paths that are based at least in part on the first set of list decoding paths. The operations of block 1325 may be performed according to the methods described herein. In certain examples, aspects of the operations of block 1325 may be performed by a list decoding operation manager as described with reference to FIGS. 6 through 8.

At block 1330 the UE 115 or base station 105 may determine whether at least one of the second set of decoding paths satisfy the first error check process is based at least in part on the marking of the at least one list decoding path. The operations of block 1330 may be performed according to the methods described herein. In certain examples, aspects of the operations of block 1330 may be performed by an error check manager as described with reference to FIGS. 6 through 8.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell. The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 of FIG. 1—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
monitoring, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code;
performing a list decoding operation on a first portion of sub-channels of the decoding candidate corresponding to the first information vector and the first error check vector to obtain a first set of list decoding paths;
determining, for the first set of list decoding paths, that at least one list decoding path of the first set of list decoding paths satisfies a first error check process using respective decoding path candidates for the first error check vector and the first information vector;
performing the list decoding operation on a second portion of the sub-channels of the decoding candidate corresponding to at least a subset of the second information vector to obtain a second set of list decoding paths that are based at least in part on the first set of list decoding paths; and
determining whether at least one of the second set of decoding paths satisfy the first error check process.

2. The method of claim 1, further comprising:
terminating, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate.

3. The method of claim 1, further comprising:
marking the at least one list decoding path of the first set of list decoding paths that satisfies the first error check process using the first error check vector, wherein determining whether at least one of the second set of decoding paths satisfy the first error check process is based at least in part on the marking of the at least one list decoding path.

4. The method of claim 3, further comprising:
propagating the marking of the at least one list decoding path to child list decoding paths as part of performing the list decoding operation on the second portion of the sub-channels of the decoding candidate, wherein each child list decoding path associated with the second portion of the sub-channels of the decoding candidate includes an indication of whether the child list decoding path was marked during the first error check process.

5. The method of claim 1, further comprising:
performing the list decoding operation on a third portion of the sub-channels of the decoding candidate corresponding to the first information vector, the second information vector, the first error check vector, and a second error check vector to obtain a third set of list decoding paths, the second error check vector positioned after the second information vector; and
determining, for the third set of list decoding paths, that at least one list decoding path of the third set of list decoding paths satisfies both the first error check process and a second error check process using respective decoding path candidates for the first information vector, the first error check vector, the second information vector, and the second error check vector.

6. The method of claim 5, further comprising:
performing the list decoding operation on a fourth portion of the sub-channels of the decoding candidate corresponding to at least a subset of a third information vector positioned after the second error check vector to obtain a fourth set of list decoding paths that are based at least in part on the third set of list decoding paths; and
determining whether at least one of the fourth set of list decoding paths satisfies the first error check process and the second error check process.

7. The method of claim 6, further comprising:
terminating, prior to completion of the list decoding operation on the decoding candidate of the codeword, the list decoding operation based at least in part on a failure of the first error check process and a failure of the second error check process for all of the fourth set of list decoding paths determined while performing the list decoding operation on the fourth portion of the sub-channels of the decoding candidate.

8. The method of claim 1, further comprising:
performing the first error check process using the first error check vector on the second set of decoding paths as part of performing the list decoding operation on the second portion of the sub-channels of the decoding candidate corresponding to at least the subset of the second information vector, wherein determining whether at least one of the second set of decoding paths satisfies the first error check process is based at least in part on performing the first error check process while performing the list decoding operation on the second portion of the sub-channels of the decoding candidate.

9. The method of claim 1, wherein:
the determining whether at least one of the second set of decoding paths satisfy the first error check process occurs at a plurality of intermediate locations of the second portion of the sub-channels of the decoding candidate corresponding to at least the subset of the second information vector.

10. The method of claim 9, wherein:
the plurality of intermediate locations corresponds to each sub-channel of the second portion of the sub-channels of the decoding candidate.

11. An apparatus for wireless communication, comprising:
means for monitoring, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code;
means for performing a list decoding operation on a first portion of sub-channels of the decoding candidate corresponding to the first information vector and the first error check vector to obtain a first set of list decoding paths;
means for determining, for the first set of list decoding paths, that at least one list decoding path of the first set of list decoding paths satisfies a first error check process using respective decoding path candidates for the first error check vector and the first information vector;
means for performing the list decoding operation on a second portion of the sub-channels of the decoding candidate corresponding to at least a subset of the second information vector to obtain a second set of list decoding paths that are based at least in part on the first set of list decoding paths; and
means for determining whether at least one of the second set of decoding paths satisfy the first error check process.

12. The apparatus of claim 11, further comprising:
means for terminating, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate.

13. The apparatus of claim 11, further comprising:
means for marking the at least one list decoding path of the first set of list decoding paths that satisfies the first error check process using the first error check vector, wherein determining whether at least one of the second set of decoding paths satisfy the first error check process is based at least in part on the marking of the at least one list decoding path.

14. The apparatus of claim 13, further comprising:
means for propagating the marking of the at least one list decoding path to child list decoding paths as part of performing the list decoding operation on the second portion of the sub-channels of the decoding candidate, wherein each child list decoding path associated with the second portion of the sub-channels of the decoding candidate includes an indication of whether the child list decoding path was marked during the first error check process.

15. The apparatus of claim 11, further comprising:
means for performing the list decoding operation on a third portion of the sub-channels of the decoding candidate corresponding to the first information vector, the second information vector, the first error check vector, and a second error check vector to obtain a third set of list decoding paths, the second error check vector positioned after the second information vector; and
means for determining, for the third set of list decoding paths, that at least one list decoding path of the third set of list decoding paths satisfies both the first error check process and a second error check process using respective decoding path candidates for the first information vector, the first error check vector, the second information vector, and the second error check vector.

16. The apparatus of claim 15, further comprising:
means for performing the list decoding operation on a fourth portion of the sub-channels of the decoding candidate corresponding to at least a subset of a third information vector positioned after the second error check vector to obtain a fourth set of list decoding paths that are based at least in part on the third set of list decoding paths; and
means for determining whether at least one of the fourth set of list decoding paths satisfies the first error check process and the second error check process.

17. The apparatus of claim 16, further comprising:
means for terminating, prior to completion of the list decoding operation on the decoding candidate of the codeword, the list decoding operation based at least in part on a failure of the first error check process and a failure of the second error check process for all of the fourth set of list decoding paths determined while performing the list decoding operation on the fourth portion of the sub-channels of the decoding candidate.

18. The apparatus of claim 11, further comprising:
means for performing the first error check process using the first error check vector on the second set of decoding paths as part of performing the list decoding operation on the second portion of the sub-channels of the decoding candidate corresponding to at least the subset of the second information vector, wherein determining whether at least one of the second set of decoding paths satisfies the first error check process is based at least in part on performing the first error check process while performing the list decoding operation on the second portion of the sub-channels of the decoding candidate.

19. The apparatus of claim 11, wherein:
the means for determining whether at least one of the second set of decoding paths satisfy the first error check process occurs at a plurality of intermediate locations of the second portion of the sub-channels of the decoding candidate corresponding to at least the subset of the second information vector.

20. The apparatus of claim 19, wherein:
the plurality of intermediate locations corresponds to each sub-channel of the second portion of the sub-channels of the decoding candidate.

21. An apparatus for wireless communication, comprising:
a processor;
memory in electronic communication with the processor; and instructions stored in the memory and operable, when executed by the processor, to cause the apparatus to:

monitor, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code;

perform a list decoding operation on a first portion of sub-channels of the decoding candidate corresponding to the first information vector and the first error check vector to obtain a first set of list decoding paths;

determine, for the first set of list decoding paths, that at least one list decoding path of the first set of list decoding paths satisfies a first error check process using respective decoding path candidates for the first error check vector and the first information vector;

perform the list decoding operation on a second portion of the sub-channels of the decoding candidate corresponding to at least a subset of the second information vector to obtain a second set of list decoding paths that are based at least in part on the first set of list decoding paths; and determine whether at least one of the second set of decoding paths satisfy the first error check process.

22. The apparatus of claim 21, wherein the instructions are further executable by the processor to:

terminate, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate.

23. The apparatus of claim 21, wherein the instructions are further executable by the processor to:

mark the at least one list decoding path of the first set of list decoding paths that satisfies the first error check process using the first error check vector, wherein determining whether at least one of the second set of decoding paths satisfy the first error check process is based at least in part on the marking of the at least one list decoding path.

24. The apparatus of claim 23, wherein the instructions are further executable by the processor to:

propagate the marking of the at least one list decoding path to child list decoding paths as part of performing the list decoding operation on the second portion of the sub-channels of the decoding candidate, wherein each child list decoding path associated with the second portion of the sub-channels of the decoding candidate includes an indication of whether the child list decoding path was marked during the first error check process.

25. The apparatus of claim 21, wherein the instructions are further executable by the processor to:

perform the list decoding operation on a third portion of the sub-channels of the decoding candidate corresponding to the first information vector, the second information vector, the first error check vector, and a second error check vector to obtain a third set of list decoding paths, the second error check vector positioned after the second information vector; and determine, for the third set of list decoding paths, that at least one list decoding path of the third set of list decoding paths satisfies both the first error check process and a second error check process using respective decoding path candidates for the first information vector, the first error check vector, the second information vector, and the second error check vector.

26. The apparatus of claim 25, wherein the instructions are further executable by the processor to:

perform the list decoding operation on a fourth portion of the sub-channels of the decoding candidate corresponding to at least a subset of a third information vector positioned after the second error check vector to obtain a fourth set of list decoding paths that are based at least in part on the third set of list decoding paths; and determine whether at least one of the fourth set of list decoding paths satisfies the first error check process and the second error check process.

27. The apparatus of claim 26, wherein the instructions are further executable by the processor to:

terminate, prior to completion of the list decoding operation on the decoding candidate of the codeword, the list decoding operation based at least in part on a failure of the first error check process and a failure of the second error check process for all of the fourth set of list decoding paths determined while performing the list decoding operation on the fourth portion of the sub-channels of the decoding candidate.

28. The apparatus of claim 21, wherein the instructions are further executable by the processor to:

perform the first error check process using the first error check vector on the second set of decoding paths as part of performing the list decoding operation on the second portion of the sub-channels of the decoding candidate corresponding to at least the subset of the second information vector, wherein determining whether at least one of the second set of decoding paths satisfies the first error check process is based at least in part on performing the first error check process while performing the list decoding operation on the second portion of the sub-channels of the decoding candidate.

29. The apparatus of claim 21, wherein:

the determining whether at least one of the second set of decoding paths satisfy the first error check process occurs at a plurality of intermediate locations of the second portion of the sub-channels of the decoding candidate corresponding to at least the subset of the second information vector.

30. The apparatus of claim 29, wherein:

the plurality of intermediate locations corresponds to each sub-channel of the second portion of the sub-channels of the decoding candidate.

31. A non-transitory computer readable medium storing code for wireless communication, the code comprising instructions executable by a processor to:

monitor, at a user equipment (UE), for a decoding candidate of a codeword encoded according to a polar code, wherein the decoding candidate is based at least in part on a first information vector, a second information vector, and a first error check vector positioned between the first information vector and the second information vector according to a decoding order of the polar code;

perform a list decoding operation on a first portion of sub-channels of the decoding candidate corresponding to the first information vector and the first error check vector to obtain a first set of list decoding paths;

determine, for the first set of list decoding paths, that at least one list decoding path of the first set of list decoding paths satisfies a first error check process using respective decoding path candidates for the first error check vector and the first information vector;

perform the list decoding operation on a second portion of the sub-channels of the decoding candidate corresponding to at least a subset of the second information vector to obtain a second set of list decoding paths that are based at least in part on the first set of list decoding paths; and determine whether at least one of the second set of decoding paths satisfy the first error check process.

32. The non-transitory computer-readable medium of claim 31, wherein the instructions are further executable by the processor to:

terminate, prior to completion of the list decoding operation on the decoding candidate of the codeword, the list decoding operation based at least in part on a failure of the first error check process for all of the second set of list decoding paths determined while performing the list decoding operation on the second portion of the sub-channels of the decoding candidate.

33. The non-transitory computer-readable medium of claim 31, wherein the instructions are further executable by the processor to:

mark the at least one list decoding path of the first set of list decoding paths that satisfies the first error check process using the first error check vector, wherein determining whether at least one of the second set of decoding paths satisfy the first error check process is based at least in part on the marking of the at least one list decoding path.

34. The non-transitory computer-readable medium of claim 33, wherein the instructions are further executable by the processor to:

propagate the marking of the at least one list decoding path to child list decoding paths as part of performing the list decoding operation on the second portion of the sub-channels of the decoding candidate, wherein each child list decoding path associated with the second portion of the sub-channels of the decoding candidate includes an indication of whether the child list decoding path was marked during the first error check process.

35. The non-transitory computer-readable medium of claim 31, wherein the instructions are further executable by the processor to:

perform the list decoding operation on a third portion of the sub-channels of the decoding candidate corresponding to the first information vector, the second information vector, the first error check vector, and a second error check vector to obtain a third set of list decoding paths, the second error check vector positioned after the second information vector; and determine, for the third set of list decoding paths, that at least one list decoding path of the third set of list decoding paths satisfies both the first error check process and a second error check process using respective decoding path candidates for the first information vector, the first error check vector, the second information vector, and the second error check vector.

36. The non-transitory computer-readable medium of claim 35, wherein the instructions are further executable by the processor to:

perform the list decoding operation on a fourth portion of the sub-channels of the decoding candidate corresponding to at least a subset of a third information vector positioned after the second error check vector to obtain a fourth set of list decoding paths that are based at least in part on the third set of list decoding paths; and determine whether at least one of the fourth set of list decoding paths satisfies the first error check process and the second error check process.

37. The non-transitory computer-readable medium of claim 36, wherein the instructions are further executable by the processor to:

terminate, prior to completion of the list decoding operation on the decoding candidate of the codeword, the list decoding operation based at least in part on a failure of the first error check process and a failure of the second error check process for all of the fourth set of list decoding paths determined while performing the list decoding operation on the fourth portion of the sub-channels of the decoding candidate.

38. The non-transitory computer-readable medium of claim 31, wherein the instructions are further executable by the processor to:

perform the first error check process using the first error check vector on the second set of decoding paths as part of performing the list decoding operation on the second portion of the sub-channels of the decoding candidate corresponding to at least the subset of the second information vector, wherein determining whether at least one of the second set of decoding paths satisfies the first error check process is based at least in part on performing the first error check process while performing the list decoding operation on the second portion of the sub-channels of the decoding candidate.

39. The non-transitory computer-readable medium of claim 31, wherein:

the determining whether at least one of the second set of decoding paths satisfy the first error check process occurs at a plurality of intermediate locations of the second portion of the sub-channels of the decoding candidate corresponding to at least the subset of the second information vector.

40. The non-transitory computer-readable medium of claim 39, wherein:

the plurality of intermediate locations corresponds to each sub-channel of the second portion of the sub-channels of the decoding candidate.

* * * * *